(12) United States Patent
Adachi et al.

(10) Patent No.: US 10,951,059 B2
(45) Date of Patent: Mar. 16, 2021

(54) HARMONIC DETECTION SYSTEM

(71) Applicant: Omron Corporation, Kyoto (JP)

(72) Inventors: Tatsuya Adachi, Ichinomiya (JP); Hiroaki Takeya, Aichi (JP); Mitsunori Sugiura, Nagoya (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 16/481,142

(22) PCT Filed: Nov. 24, 2017

(86) PCT No.: PCT/JP2017/042187
§ 371 (c)(1),
(2) Date: Jul. 26, 2019

(87) PCT Pub. No.: WO2018/168092
PCT Pub. Date: Sep. 20, 2018

(65) Prior Publication Data
US 2019/0363575 A1    Nov. 28, 2019

(30) Foreign Application Priority Data

Mar. 15, 2017  (JP) .............................. JP2017-050406

(51) Int. Cl.
*H02J 13/00* (2006.01)
*G01R 11/00* (2006.01)
(Continued)

(52) U.S. Cl.
CPC .......... *H02J 13/0017* (2013.01); *G01R 11/00* (2013.01); *G01R 15/142* (2013.01);
(Continued)

(58) Field of Classification Search
CPC ...... G01R 11/00; G01R 15/142; G01R 15/26; G01R 19/0092; G01R 19/2513;
(Continued)

(56) References Cited

U.S. PATENT DOCUMENTS

| 4,689,752 A | 8/1987 | Fernandes et al. |
| 6,618,648 B1 | 9/2003 | Shirota et al. |

(Continued)

FOREIGN PATENT DOCUMENTS

| JP | S63-133844 A | 6/1988 |
| JP | H11-341706 A | 12/1999 |

(Continued)

OTHER PUBLICATIONS

International Search Report issued in Application No. PCT/JP2017/042187, dated Dec. 26, 2017 (4 pages).

(Continued)

*Primary Examiner* — Chad G Erdman
(74) *Attorney, Agent, or Firm* — Osha Bergman Watanabe & Burton LLP

(57) ABSTRACT

A harmonic detection system (1) comprises a measurement component (71), a harmonic abnormality determination unit (561), and a smartphone (9). The measurement component (71) is installed at a specific position on a distribution line constituting a distribution network (100), and measures data related to the current of the distribution line. The harmonic abnormality determination unit (561) uses some or all of the data related to current as detection data to detect abnormality related to harmonics. The smartphone (9) is owned by a user (G), and notifies the user that an abnormality has occurred in the distribution line when a harmonic is detected.

16 Claims, 23 Drawing Sheets

(51) Int. Cl.
*G01R 15/14* (2006.01)
*G01R 15/26* (2006.01)
*G01R 19/00* (2006.01)
*G01R 21/00* (2006.01)
*G01R 23/16* (2006.01)
*H04B 3/54* (2006.01)
*G05B 23/02* (2006.01)

(52) U.S. Cl.
CPC .......... *G01R 15/26* (2013.01); *G01R 19/0092* (2013.01); *G01R 21/00* (2013.01); *G01R 23/16* (2013.01); *G05B 23/0205* (2013.01); *H02J 13/0086* (2013.01); *H04B 3/54* (2013.01); *H04B 2203/5404* (2013.01)

(58) Field of Classification Search
CPC ...... G01R 21/00; G01R 23/16; G01R 23/177; G01R 23/18; G01R 23/20; H02J 13/00002; H02J 13/00022; H02J 13/00034; H02J 13/0017; H02J 13/0086; H02J 3/0012; H04B 2203/5404; H04B 3/54
See application file for complete search history.

(56) References Cited

U.S. PATENT DOCUMENTS

| | | | | |
|---|---|---|---|---|
| 2006/0071776 | A1* | 4/2006 | White, II | H04B 3/546 340/538 |
| 2006/0170410 | A1* | 8/2006 | Bjorn | G01R 19/2513 324/96 |
| 2016/0025778 | A1 | 1/2016 | Tokusaki et al. | |
| 2016/0124400 | A1* | 5/2016 | Kanayama | H02J 3/38 307/116 |
| 2016/0164290 | A1* | 6/2016 | Hall | H02J 3/24 700/298 |
| 2019/0187736 | A1* | 6/2019 | Toizumi | G01R 19/2509 |

FOREIGN PATENT DOCUMENTS

| | | |
|---|---|---|
| JP | 2005-24469 A | 1/2005 |
| JP | 2006-109545 A | 4/2006 |
| JP | 2007-244098 A | 9/2007 |
| JP | 2008-61448 A | 3/2008 |
| JP | 2009-207321 A | 9/2009 |
| JP | 2013-223359 A | 10/2013 |
| JP | 2014-178238 A | 9/2014 |
| JP | 2015-76955 A | 4/2015 |
| JP | 2015-184179 A | 10/2015 |
| JP | 2017-34752 A | 2/2017 |
| WO | 2016/194814 A1 | 12/2016 |

OTHER PUBLICATIONS

Written Opinion issued in International Application No. PCT/JP2017/042187, dated Dec. 26, 2017 (10 pages).
International Search Report issued in corresponding Application No. PCT/JP2017/042185, dated Dec. 26, 2017 (4 pages).
Written Opinion issued in corresponding International Application No. PCT/JP2017/042185, dated Dec. 26, 2017 (12 pages).

* cited by examiner

Measurement information table 202

| CT sensor ID | Time information | Effective value | Power spectrum |
|---|---|---|---|
| 001 | 2017/2/6/09:02:30 | 100mA | fundamental wave:100db,third harmonic wave:0db,fifth harmonic wave:0db |
| | 2017/2/6/09:08:30 | 101mA | fundamental wave:95db,third harmonic wave:1db,fifth harmonic wave:0db |
| | 2017/2/6/09:14:30 | 105mA | fundamental wave:95db,third harmonic wave:10db,fifth harmonic wave:0db |
| | 2017/2/6/09:20:30 | 107mA | fundamental wave:92db,third harmonic wave:5db,fifth harmonic wave:0db |
| | 2017/2/6/09:26:30 | 106mA | fundamental wave:98db,third harmonic wave:0db,fifth harmonic wave:0db |
| | 2017/2/6/09:32:30 | 104mA | fundamental wave:101db,third harmonic wave:3db,fifth harmonic wave:1db |
| | 2017/2/6/09:38:30 | 108mA | fundamental wave:105db,third harmonic wave:4db,fifth harmonic wave:5db |
| | 2017/2/6/09:44:30 | 103mA | fundamental wave:94db,third harmonic wave:3db,fifth harmonic wave:3db |
| | 2017/2/6/09:50:30 | 105mA | fundamental wave:103db,third harmonic wave:12db,fifth harmonic wave:10db |
| | 2017/2/6/09:56:30 | 104mA | fundamental wave:91db,third harmonic wave:32db,fifth harmonic wave:21db |
| 002 | ...... | ...... | ...... |

FIG. 8

Setting information table

| Area code | Relay management code | Group ID | Classification ID | CT sensor ID | Meter ID |
|---|---|---|---|---|---|
| A01 | A01_01 | R | BR00 | 001 | — |
| | | | | 002 | — |
| | | | BR01 | 003 | sm000 |
| | | S | BR00 | ⋮ | ⋮ |
| | | | BR01 | ⋮ | ⋮ |
| | | T | BR00 | ⋮ | ⋮ |
| | | | BR01 | n | sm00n |
| | A01_02 | R | BR00 | 001 | — |
| | | | | 002 | — |
| | | | BR01 | ⋮ | ⋮ |
| | | S | BR00 | ⋮ | ⋮ |
| | | | BR01 | ⋮ | ⋮ |
| | | T | BR00 | ⋮ | ⋮ |
| | | | BR01 | m | sm00m |
| | ⋮ | ⋮ | ⋮ | ⋮ | ⋮ |

203

| Time information | 2017/2/6/09:58:55 |
|---|---|

FIG. 11

Measurement information table

| Area code | Relay management code | CT sensor ID | Time information | Effective value | Power spectrum |
|---|---|---|---|---|---|
| A01 | A01_01 | 001 | 2017/2/6/09:02:30 | 100mA | fundamental wave:100db,third harmonic wave:0db,fifth harmonic wave:0db |
| | | | 2017/2/6/09:08:30 | 101mA | fundamental wave:95db,third harmonic wave:1db,fifth harmonic wave:0db |
| | | | 2017/2/6/09:14:30 | 105mA | fundamental wave:95db,third harmonic wave:10db,fifth harmonic wave:0db |
| | | | 2017/2/6/09:20:30 | 107mA | fundamental wave:92db,third harmonic wave:5db,fifth harmonic wave:0db |
| | | | 2017/2/6/09:26:30 | 106mA | fundamental wave:98db,third harmonic wave:0db,fifth harmonic wave:0db |
| | | | 2017/2/6/09:32:30 | 104mA | fundamental wave:101db,third harmonic wave:3db,fifth harmonic wave:1db |
| | | | 2017/2/6/09:38:30 | 108mA | fundamental wave:105db,third harmonic wave:4db,fifth harmonic wave:5db |
| | | | 2017/2/6/09:44:30 | 103mA | fundamental wave:94db,third harmonic wave:3db,fifth harmonic wave:3db |
| | | | 2017/2/6/09:50:30 | 105mA | fundamental wave:103db,third harmonic wave:12db,fifth harmonic wave:10db |
| | | | 2017/2/6/09:56:30 | 104mA | fundamental wave:91db,third harmonic wave:32db,fifth harmonic wave:21db |

Position information management table

| Area code | Relay management code | CT sensor ID | Position code |
|---|---|---|---|
| A01 | A01_01 | 001 | 35.323890,136.758432 |
| | | 002 | 35.323892,136.758434 |
| | ⋮ | ⋮ | ⋮ |
| | A01_m | 002 | 35.324471,136.761068 |
| | A02_01 | 001 | 35.170220,136.882467 |
| | ⋮ | ⋮ | ⋮ |

User management table

| Meter ID | User ID | Registration number |
|----------|---------|---------------------|
| SM000    | 001     | 090-XXXX-XXXX       |
| ...      | ...     | ...                 |

206

Abnormality management table

| Area code | Relay management code | CT sensor ID | State Harmonic |
|---|---|---|---|
| A01 | A01_01 | 001 | normal |
| | | 002 | Lv3 |
| | ... | ... | ... |
| | A01_m | 002 | normal |
| | A02_01 | 001 | Lv2 |
| | ... | ... | ... |

HARMONIC DETECTION SYSTEM

FIELD

The present invention relates to a harmonic detection system for detecting harmonics.

BACKGROUND

Conventionally, the monitoring of harmonics in a power distribution network has been performed by periodic patrols by workers. During a patrol, the worker takes electrical measurements on a power line at specific positions or between specific positions to check for abnormalities related to harmonics.

When taking these electrical measurements in a patrol, the worker uses a measurement device that is attached to the power line and measures the waveform of the current flowing through the power line by means of a current transformer (CT) (see Patent Literature 1, for example).

CITATION LIST

Patent Literature

Patent Literature 1: JP-A 2014-178238

SUMMARY

However, in the monitoring of harmonics as described above, it is necessary for a number of workers to visit the measurement sites in the course of a patrol, so the measurement takes a long time and costs a considerable amount. Also, abnormalities cannot be detected during the period in between regular patrols, which makes it difficult to detect sudden abnormalities quickly.

It is an object of the present invention to provide a harmonic detection system capable of detecting abnormalities quickly and at low cost.

Solution to Problem

The harmonic detection system according to the first invention comprises a measurement component, a harmonic detector, and a notification device. The measurement component is installed at a specific position on a power line constituting a distribution network, and measures data related to the current of the power line. The harmonic detector uses some or all of the data related to the current as detection data to detect a harmonic. The notification device is owned by the user of the power supplied by the power line and notifies the user that an abnormality has occurred in the power line when the harmonic is detected.

This makes it possible to detect abnormalities related to harmonics, and the user can be notified of this detection result by a notification device owned by the user.

Accordingly, the user can recognize the detection of an abnormality, and a worker does not have to patrol periodically to perform monitoring, so the cost can be lowered.

Also, since the measurement component can be always installed on the power line, measurement of the power line current can be performed whenever desired, and an abnormality in the power distribution network can be detected quickly.

In addition, since the user can recognize that an abnormality related to harmonics has occurred in the power line being used by the user, the user can sometimes deal with the abnormality by checking his own electrical equipment.

The harmonic detection system according to the second invention is the harmonic detection system according to the first invention, further comprising a first transmitter. The first transmitter transmits information related to detection of a harmonic to the notification device if there is a registered user of the power supplied by the power line when the harmonic is detected.

Consequently, the notification device can transmit the information that the harmonic has been detected to a portable terminal or the like owned by the user so that the user can be notified quickly.

The harmonic detection system according to the third invention is the harmonic detection system according to the first or second invention, further comprising a measuring instrument and a management device. The measuring instrument has a measurement component and transmits detection data. The management device has a harmonic detector and receives detection data.

This makes it possible for harmonic abnormalities to be detected automatically at the management device.

The harmonic detection system according to the fourth invention is the harmonic detection system according to the third invention, wherein the measuring instrument is installed on each of a plurality of power lines. The harmonic detection system further comprises a relay. The relay receives the detection data transmitted from the plurality of measuring instruments by the relay and transmits it to the management device by the relay.

Consequently, the detection data first be collected from the plurality of measuring instruments and then transmitted to the management device.

The harmonic detection system according to the fifth invention is the harmonic detection system according to the first or second invention, comprising a measuring instrument, a relay, and a management device. The measuring instrument has a measurement component and transmits detection data. The relay has a harmonic detector, receives detection data, and transmits detection result data related to the detection result produced by the harmonic detector. The management device receives the detection result data.

Consequently, abnormality detection is performed at the relay, and the abnormality detection result can be transmitted to a host management device. Therefore, the amount of data transmitted to the a host management device can be reduced, and the power consumption used for data transmission can be decreased.

In addition, data processing can be simplified in the management device or other host system. It is also possible to increase the number of relays connected to the management device by reducing transmission data.

The harmonic detection system according to the sixth invention is the harmonic detection system according to the first or second invention, further comprising a measuring instrument and a management device. The measuring instrument has a measurement component and a harmonic detector and transmits detection result data related to the harmonic detection result produced by the harmonic detector. The management device receives the detection result data.

Consequently, abnormality detection can be performed in the measuring instrument, and the abnormality detection result can be transmitted to the management device. Therefore, the amount of data transmitted to the management device can be reduced, and the power consumption used for data transmission can be decreased.

Also, data processing can be simplified in the management device or other host system. It is also possible to increase the number of measuring instruments connected to the management device by reducing transmission data.

A relay may be provided between the measuring instrument and the management device.

The harmonic detection system according to the seventh invention is the harmonic detection system according to the second invention, further comprising a second transmitter. The second transmitter transmits detection result data related to the detection result produced by the harmonic detector to a maintenance device that maintains the power line, when the harmonic detector has detected a harmonic. The first transmitter is provided to the maintenance device.

Consequently, the maintenance device that maintains the distribution network including the power line on which the harmonic was detected can be advised that a harmonic has been detected, and information related to the detection of the harmonic can be transmitted from the maintenance device to the notification device.

The harmonic detection system according to the eighth invention is the harmonic detection system according to any of the first to seventh inventions, wherein the detection data includes information about the fundamental wave of the current of the power line, and about harmonics to the fundamental wave.

Abnormalities related to harmonics can thus be detected by finding the fundamental wave and the harmonic from the current waveform of the power line.

The harmonic detection system according to the ninth invention is the harmonic detection system according to the eighth invention, wherein the information related to the fundamental wave and the harmonic is the power spectrum of the fundamental wave and the harmonic. The harmonic detector determines that the harmonic is included in the fundamental wave when the ratio of the harmonic to the fundamental wave is at or over a preset threshold.

A harmonic abnormality can thus be detected by calculating the power spectrum values for the fundamental wave and the harmonic, so the generation of a harmonic can be promptly detected and dealt with.

The harmonic detection system according to the tenth invention is the harmonic detection system according to the ninth invention, wherein a plurality of thresholds are set so as to increase in stages. The harmonic detector determines that the degree of abnormality due to the harmonic is greater the more the larger threshold is exceeded.

Since the degree of abnormality can thus be determined, the larger is the degree of abnormality, the more promptly it can be dealt with.

For example, thresholds can be set for the value of the warning level, the value of the required action level, and the value of the emergency action level, and the action priority can be determined.

The harmonic detection system according to the eleventh invention is the harmonic detection system according to the eighth invention, wherein the information about harmonics to the fundamental wave includes at least information about the third harmonic and the fifth harmonic to the fundamental wave.

The lower is the order, the larger is the ratio in which it is contained in the fundamental wave, so it can be determined whether or not an abnormality related to a harmonic has occurred by checking at least the third harmonic and the fifth harmonic.

The harmonic detection system according to the twelfth invention is the harmonic detection system according to the first invention, further comprising a storage unit. The storage unit stores the data of the measurement component in association with the data of the notification device that is a transmission destination of a notification.

This makes it possible to inform the user of the power line measured by the measurement component of the result measured by the measurement component.

The harmonic detection system according to the thirteenth invention is the harmonic detection system according to the twelfth invention, further comprising a smart meter. The smart meter detects the amount of power supplied to the power line. The storage unit stores the identification information of the measurement component in association with the identification information of the smart meter that measures the power of the power line on which the measurement component is installed, and stores identification information unique to the smart meter in association with the notification device of the user who owns the smart meter.

In installing the smart meter, the contact point (here, a notification device) of the user for whom the smart meter is installed is registered. Since the measurement component and the contact point of the user are tied together via the identification information of the smart meter, the corresponding user can be advised of the result measured by the measurement component.

The harmonic detection system according to the fourteenth invention is the harmonic detection system according to the fourth invention, wherein a plurality of the relays are provided. The plurality of measuring instruments are divided into a plurality of groups. Each of the relays receives detection data and identification information of the measurement devices from the plurality of measuring instruments belonging to each group, and transmits the identification information of the relays along with the detection data and the identification information of the measuring instruments. The management device has a storage unit. The storage unit stores the detection data in association with identification information of the measuring instruments and identification information of the relays.

Consequently, the relay can handle a plurality of measuring instruments for each group, and it is possible to identify which measuring instrument has detected an abnormality through the identification information of the relay.

In addition, detection data of measuring instruments in a group not handled can be excluded as unnecessary data.

The harmonic detection system according to the fifteenth invention is the harmonic detection system according to the fifth invention, wherein a plurality of the measuring instruments are provided. A plurality of the relays are provided. The plurality of measuring instruments are divided into a plurality of groups. Each of the relays receives the detection data and identification information of the measuring instruments from the plurality of measuring instruments belonging to each group, and transmits the identification information of the relays along with the detection data and the identification information of the measuring instruments. The management device has a storage unit. The storage unit stores the detection result data in association with identification information of the measuring instruments and identification information of the relays.

Consequently, a relay can handle a plurality of measuring instruments for each group, and it is possible to identify which measuring instrument has detected an abnormality through identification information of the relay.

In addition, detection result data of measuring instruments of a group not handled can be excluded as unnecessary data.

The harmonic detection system according to the sixteenth invention is the harmonic detection system according to the sixth invention, wherein the management device has a storage unit. The storage unit stores identification information of the measuring instrument in association with the detection result data.

This makes it possible to identify which measuring instrument has detected an abnormality.

The harmonic detection system according to the seventeenth invention is the harmonic detection system according to the first invention, further comprising a storage unit. The storage unit stores the detection data or detection result data related to the detection data produced by the harmonic detector, in association with time information.

Consequently, the time at which an abnormality was detected or the time at which the detection data was measured can be managed. Therefore, when it is confirmed that a harmonic was detected at a specific time, for example, it is possible to surmise that the harmonic is being generated from a facility, device, or the like operating at that specific time.

The harmonic detection system according to the eighteenth invention comprises a measurement component, a harmonic detector, and a transmitter. The measurement component is installed at a specific position on a power line constituting a distribution network, and measures data related to the current of the power line. The harmonic detector uses some or all of the data related to the current as detection data to detect a harmonic. The transmitter transmits detection result data related to the detection result produced by the harmonic detector to a maintenance device that maintains the power line, when the harmonic detector has detected the harmonic.

Consequently, the detection of a harmonic can be conveyed to the maintenance device that maintains the distribution network including the power line in which the harmonic was detected, and information related to the detection of the harmonic can be transmitted from the maintenance device to the notification device.

Advantageous Effects

With the present invention, it is possible to provide a harmonic detection system capable of detecting abnormalities quickly and at low cost.

BRIEF DESCRIPTION OF THE DRAWINGS

FIG. 8 is a measurement information table stored in the management database of the data collection relay in FIG. 3;

FIG. 11 is a setting information table stored in the management database of the power management device in FIG. 4;

FIG. 12 is a measurement information table stored in the management database of the power management device in FIG. 4;

FIG. 13 is a position information management table stored in the management database of the power management device in FIG. 4;

FIG. 14 is a user management table stored in the management database of the power management device in FIG. 4;

FIG. 15 is an abnormality management table, which is a log of abnormalities recorded in the management database of the power management device in FIG. 4;

DETAILED DESCRIPTION

The harmonic detection system according to an embodiment of the present invention will now be described on the basis of the drawings.

Configuration

Overview of Power Distribution Network System 10

Figure 1:
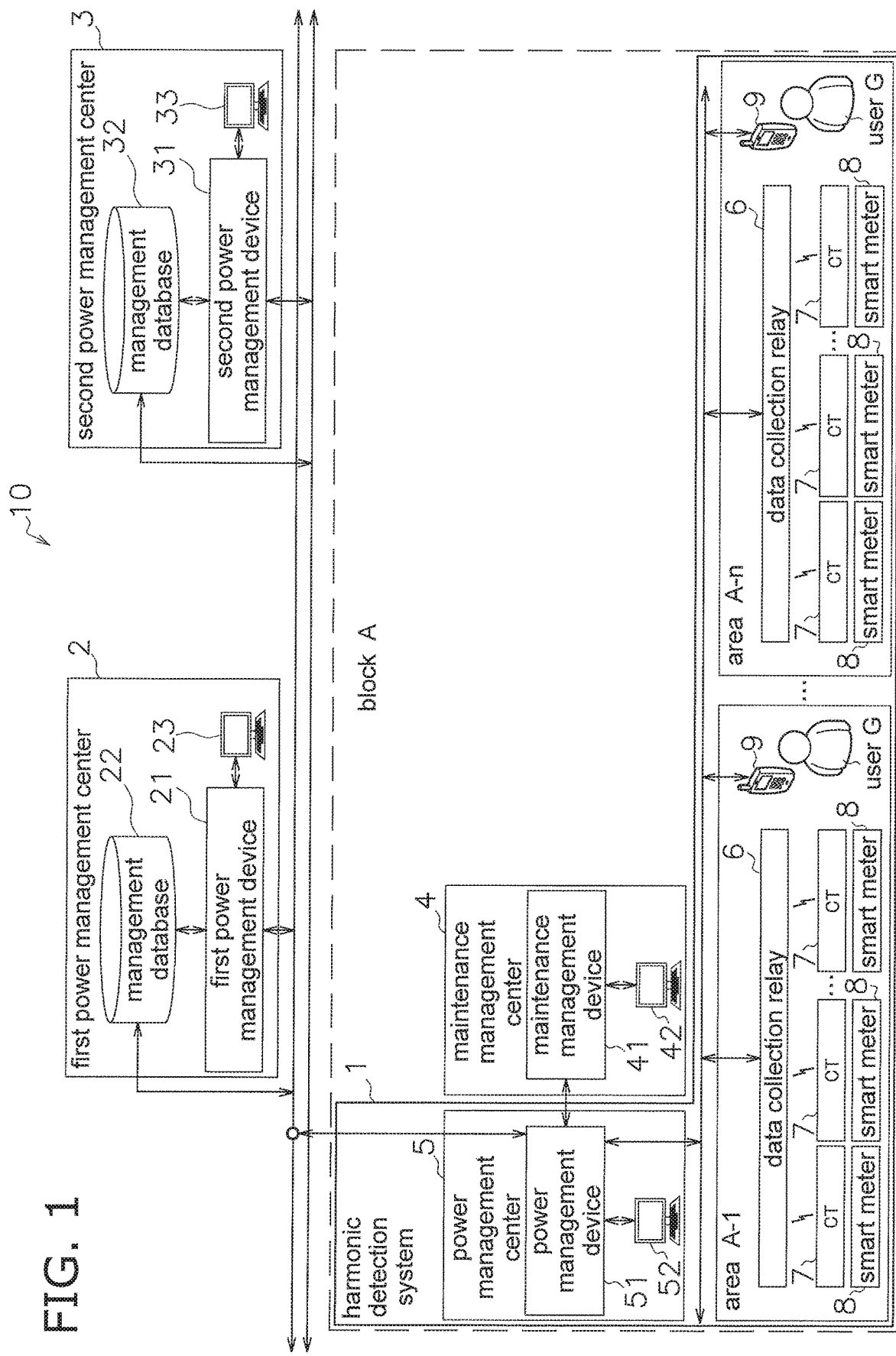
FIG. 1 is a block diagram of the configuration of a power distribution network system featuring the harmonic detection system in an embodiment of the present invention.

FIG. 1 is a block diagram of the configuration of the power distribution network system 10 according to an embodiment of the present invention.

The harmonic detection system 1 in an embodiment of the present invention is provided to the power distribution network system 10. The harmonic detection system 1 monitors a power distribution network and detects abnormalities by using a plurality of CT (current transformer) sensors 7 installed at predetermined positions of the power distribution lines constituting the power distribution network.

A first power management center 2 and a second power management center 3 are provided to the power distribution network system 10 of this embodiment. The first power management center 2 manages the power distribution network in block A. The first power management center 2 is not limited to just block A, and may manage a plurality of blocks. The second power management center 3 is similar to the first power management center 2 in that it manages the power distribution network in one or more blocks.

Here, the first power management center 2 and the second power management center 3 are, for example, management centers provided to Kansai Electric Power, Chubu Electric Power, or the like. Also, block A indicates, for example, prefectures covered by Kansai Electric Power, such as Osaka Prefecture or Nara Prefecture, and the block or blocks managed by the second power management center 3 indicate prefectures covered by Chubu Electric Power, such as Aichi Prefecture.

The power distribution network system 10 in this embodiment comprises the harmonic detection system 1 and a maintenance management center 4 for each block. The harmonic detection system 1 detects harmonics generated in the power distribution network in each block. The maintenance management center 4 performs maintenance management of each block on the basis of the detection result of the harmonic detection system 1.

The harmonic detection system 1 has a power management center 5, a plurality of data collection relays 6, a plurality of CT sensors 7, a smart meter 8, and a smartphone 9. The power management center 5 manages the power in each block and detects abnormalities in the power distribution network within a block. The data collection relays 6 collect data from the CT sensors 7. A plurality of CT sensors 7 are installed in each of the electrical areas flowing through the distribution line, and measure the current of the distribution line.

The current of the distribution line is measured by the CT sensors 7, data is sent from the CT sensors 7 to the power management center 5 via the data collection relays 6, and the power management center 5 performs harmonic detection on the basis of this data. When a harmonic is detected, a warning message is sent to the smartphone 9 on the basis of the registration information of the smart meter 8, and a warning is given to the user G.

Here, the term "area" indicates, for example, a section transmitted from a predetermined substation in a block, or a municipal section such as a city or a town.

In block A, one data collection relay 6 is provided for each of a plurality of areas A-1 to A-n, and the data of a plurality of CT sensors 7 installed in one area is collected by a single collection relay 6, although this is not the only option. A plurality of data collection relays 6 may be provided in one area, and the data of a plurality of CT sensors 7 installed in one area may be divided up and collected by a plurality of data collection relays 6. In such a case, the plurality of CT sensors 7 are divided into groups handled by a data collection relay 6, and each data collection relay 6 collects the data of the plurality of CT sensors 7 belonging to the group. In block A, it could also be said that one area handled by one data collection relay 6 constitutes one group. Thus, only one data collection relay 6 may be provided in the area, or a plurality of data collection relays 6 may be provided.

Installation of Data Collection Relays and CT Sensors

Figure 2:
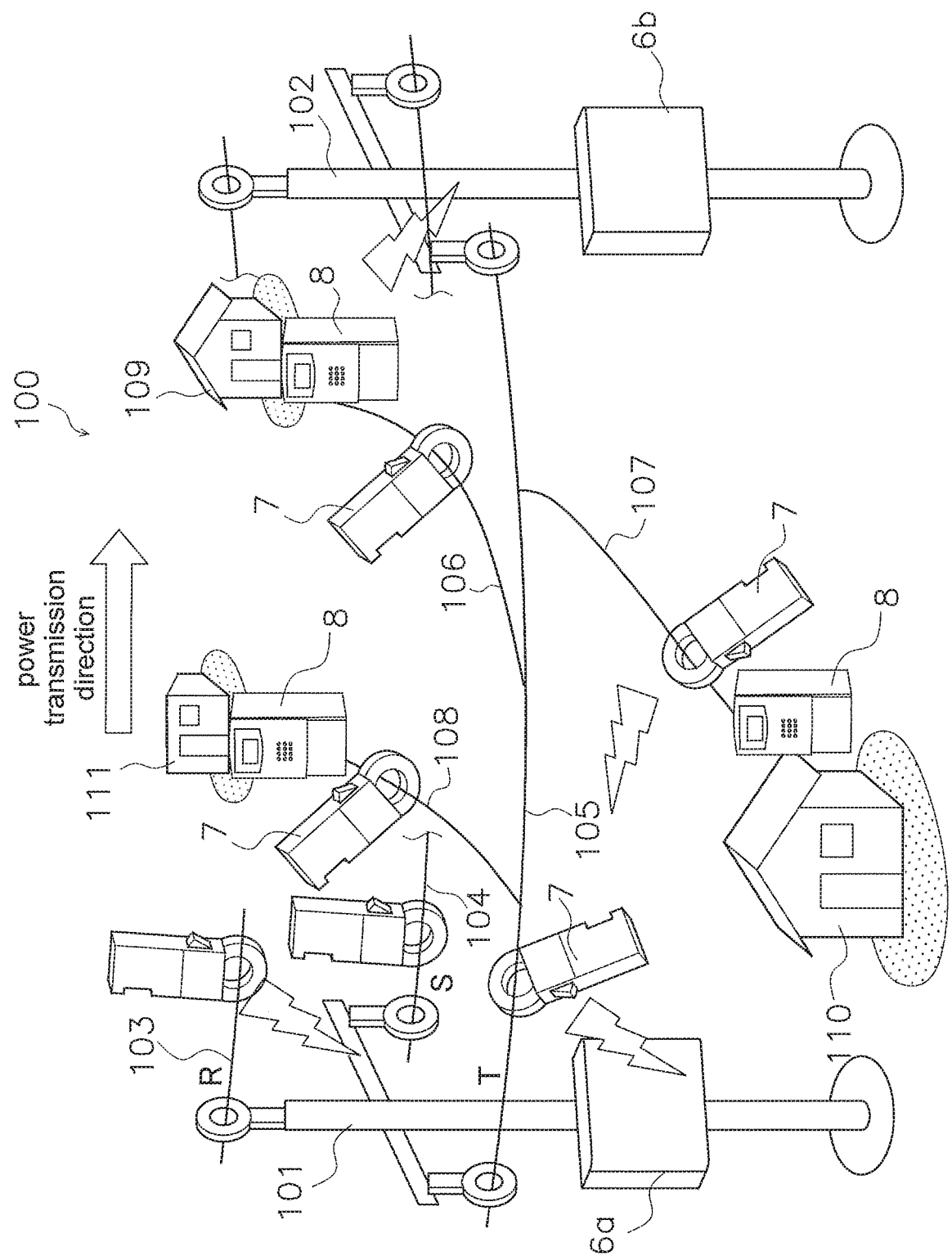
FIG. 2 shows the installation sites of the data collection relays and CT sensors in FIG. 1 in a power distribution network.

FIG. 2 shows the installation sites of the data collection relays 6 and CT sensors 7 in a power distribution network 100. In FIG. 2, a power pole 101 on the upstream side in the power transmission direction and a power pole 102 on the downstream side are shown, and distribution lines 103, 104, and 105, serving as three trunk lines constituting three phases of RST, are strung between the power pole 101 and the power pole 102. Electricity flows from the power pole 101 toward the power pole 102. The distribution line 103 is an R-phase distribution line, the distribution line 104 is an S-phase distribution line, and the distribution line 105 is a T-phase distribution line. Also, distribution lines 106, 107, and 108 branch off from the distribution line 105, and are connected to the electrical boxes of houses 109 and 110 and a factory 111.

The data collection relay 6 is installed on each of the power pole 101 and the power pole 102.

The CT sensors 7 are a clamp type, and are detachably installed on a distribution line (an example of a power line). The CT sensors 7 are installed on each of the distribution lines 103, 104, 105, 106, 107, and 108. The distribution lines 106 and 107 are run into the houses 109 and 110, respectively, via the smart meter 8. The distribution line 108 is run into the factory 111 via the smart meter 8. One smart meter 8 is provided corresponding to one CT sensor 7 in the houses 109 and 110 and the factory 111. A unique ID is assigned to each of the CT sensor 7 and the smart meter 8, and the correlation between the CT sensor 7 and the smart meter 8 is specified by a setting information table 203 in the management database 54 (discussed below).

Also, since the distribution lines 103, 104, and 105, which are trunk lines, are not run directly into a specific electrical box, no corresponding smart meter 8 is provided. Accordingly, in the setting information table 203 in the management database 54 (discussed below), it is indicated that there is no corresponding smart meter 8 for the CT sensors 7 installed on the distribution lines 103, 104, and 105.

In FIG. 2, the data of the CT sensors 7 installed on the distribution lines 106 and 107 is transmitted to the data collection relay 6 installed on the power pole 102, while the data of the CT sensors 7 installed on the distribution lines 103, 104, 105 and 108 is transmitted to the data collection relay 6 installed in the power pole 101. Communication between the CT sensors 7 and the data collection relays 6 is performed wirelessly.

Figure 3:
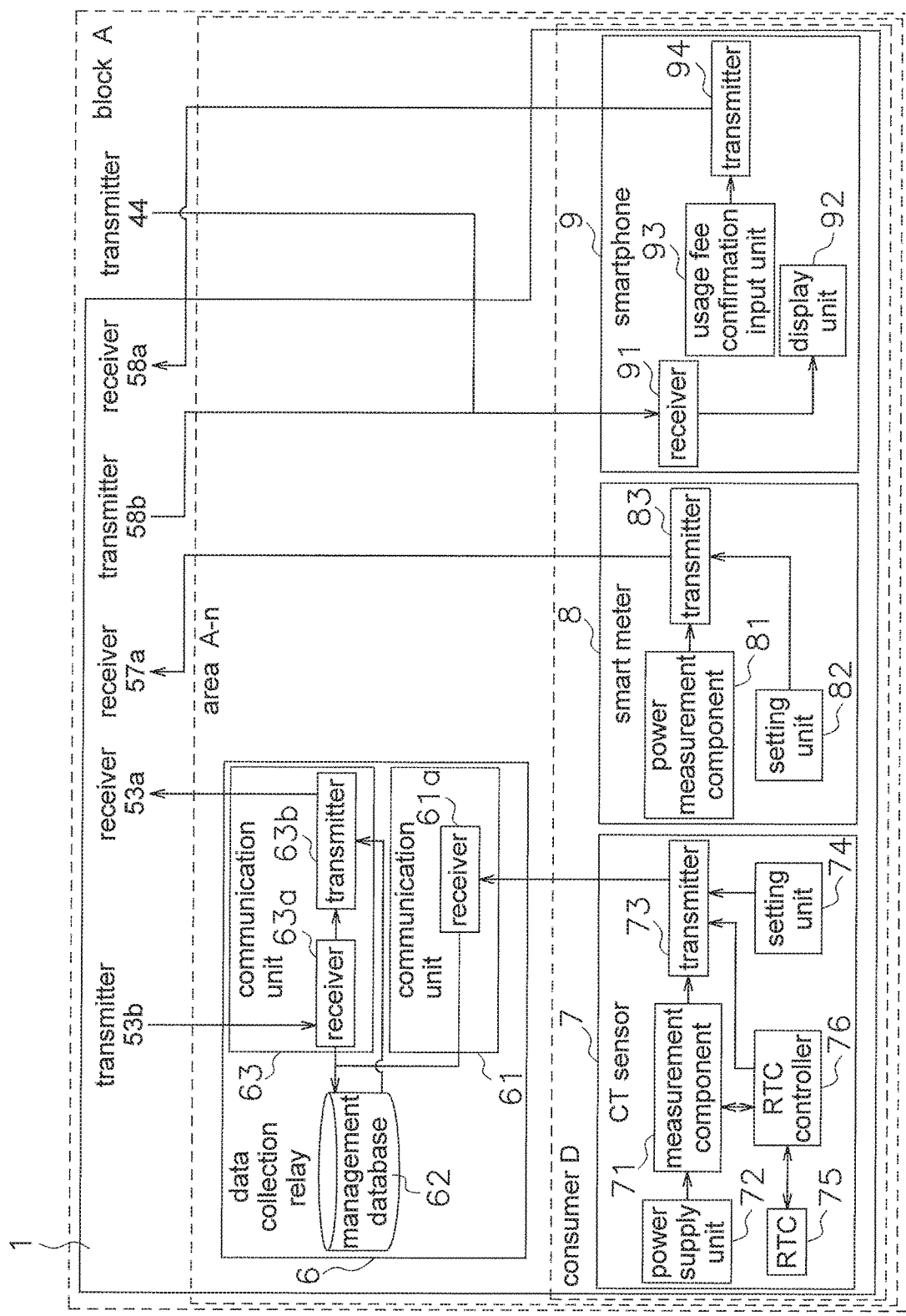
FIG. 3 is a block diagram of the configuration of the data collection relays and CT sensors in FIG. 1.

FIG. 3 is a block diagram of the configuration of a data collection relay 6 and a CT sensor 7. In FIG. 3, a consumer D is provided with a CT sensor 7, a smart meter 8, and a smartphone 9. The consumer D indicates either the house 109, the house 110, or the factory 111 in FIG. 2. That is, the CT sensor 7, the smart meter 8, and the smartphone 9 are provided to each of the houses 109 and 110 and the factory 111.

CT Sensor

As shown in FIG. 3, the CT sensor 7 has a measurement component 71, a power supply unit 72, a transmitter 73, a setting unit 74, an RTC (real time clock) 75, and an RTC controller 76, and can be removably attached to the distribution line. The measurement component 71 measures the trend of the current flowing through the distribution line by the power supply from the power supply unit 72. More precisely, the measurement component 71 has a coil unit removably attached around the distribution line, a shunt resistor for measuring the current flowing through the coil unit, and so forth. The current flowing through the distribution line can be sensed by measuring the voltage at both ends of this shunt resistor.

In addition, the measurement component 71 is provided with an operation unit (not shown), and the power spectrum values (dB) of the fundamental wave, the third harmonic, and the fifth harmonic of the current are calculated from the waveform of the sensed current.

The power supply unit 72 stores electricity generated in the coil unit, and supplies this electricity to the measurement component 71. A component is provided for switching the direction of the current generated in the coil unit to the shunt resistor side or the power supply unit 72 side, and when power is stored in the power supply unit 72, the current generated in the coil unit is not supplied to the shunt resistor, but is supplied to the power supply unit 72. Also, when the measurement component 71 measures the current, electricity does not flow to the power supply unit 72 side.

The setting unit 74 sets a sensor ID for identifying the CT sensor 7 (an example of identification information of measuring instrument, and an example of identification information of measurement component).

The RTC controller 76 acquires from the RTC 75 time information about the timing at which the measurement component 71 measures the current waveform, and transmits this time information to the transmitter 73.

The transmitter 73 wirelessly transmits to the data collection relay 6 the data measured and calculated by the measurement component 71 (the values (dB) of the power spectrum of the fundamental wave, the third harmonic, and the fifth harmonic). This data is detection data that is used to detect harmonics in the power management device 51.

The transmitter 73 also sends the sensor ID set by the setting unit 74 and the time information acquired by the RTC controller 76 in addition to the detection data as measurement information that associates the sensor ID and the time information with the detection data. The term "time information" refers to the clock time at which the current waveform was measured. The time information from the RTC controller 76 may be transmitted to the measurement component 71 and time information may be added to the detection data at the measurement component 71, or the measurement information may be transmitted from the measurement component 71 to the RTC controller 76 and time information may be added to the detection data at the RTC controller 76.

Also, the CT sensor 7 transmits the sensor ID, time information, and detection data to the data collecting relay 6 periodically, such as at six-minute intervals.

Smart Meter

As shown in FIG. 3, the smart meter 8 has a power measurement component 81, a setting unit 82, and a transmitter 83. The power measurement component 81 measures the amount of power supplied to the consumer D. The setting unit 82 sets a unique ID for the smart meter 8. The transmitter 83 transmits the power used by the consumer D as measured by the power measurement component 81 to the receiver 57*a* of the power management device 51. The transmitter 83 also transmits its own ID to the power management device 51.

Smartphone

As shown in FIG. 3, the smartphone 9 has a receiver 91, a display unit 92, a usage fee confirmation input unit 93, and a transmitter 94. The receiver 91 receives a warning message based on the detection of a harmonic from the transmitter 44 of the maintenance management device 41. Also, the receiver 91 receives the power usage fee from the transmitter 58*b* of the power management device 51. The display unit 92 displays a warning message on the basis of the abnormality notification. The usage fee confirmation input unit 93 is used by the user G to make an inquiry about the power usage fee. The transmitter 94 transmits the inquiry about power usage to the receiver 58*a* of the power management device 51.

Data Collection Relay

As shown in FIG. 3, the data collection relay 6 has a communication unit 61, a management database 62, and a communication unit 63.

The communication unit 61 communicates with a plurality of CT sensors 7. The communication unit 61 has a receiver 61*a*, and receives the measurement information (sensor ID, time information, and detection data) transmitted wirelessly from the plurality of CT sensors 7.

The management database 62 stores (as a table) and manages the setting information (see the setting information table 201 in FIG. 7 (discussed below)) and measurement information data (see the measurement information table 202 in FIG. 8 (discussed below)) transmitted from the plurality of CT sensors 7.

The communication unit 63 communicates with the power management device 51. The communication unit 63 has a receiver 63*a* and a transmitter 63*b*. The receiver 63*a* receives a setting request and a data acquisition request from the power management device 51 of the power management center 5. The data acquisition request is transmitted periodically (for example, every 60 minutes) from the power management center 5. The setting request requests the setting of the management code of the data collection relay 6. The transmitter 63*b* transmits the sensor ID, time information, detection data, and a relay management code (an example of relay identification information) to the power management center 5.

Power Management Center

As shown in FIG. 1, the power management center 5 has a power management device 51 and a display unit 52. The power management device 51 uses the detection data received from the data collection relay 6 to detect abnormalities in the power distribution network.

Figure 4:
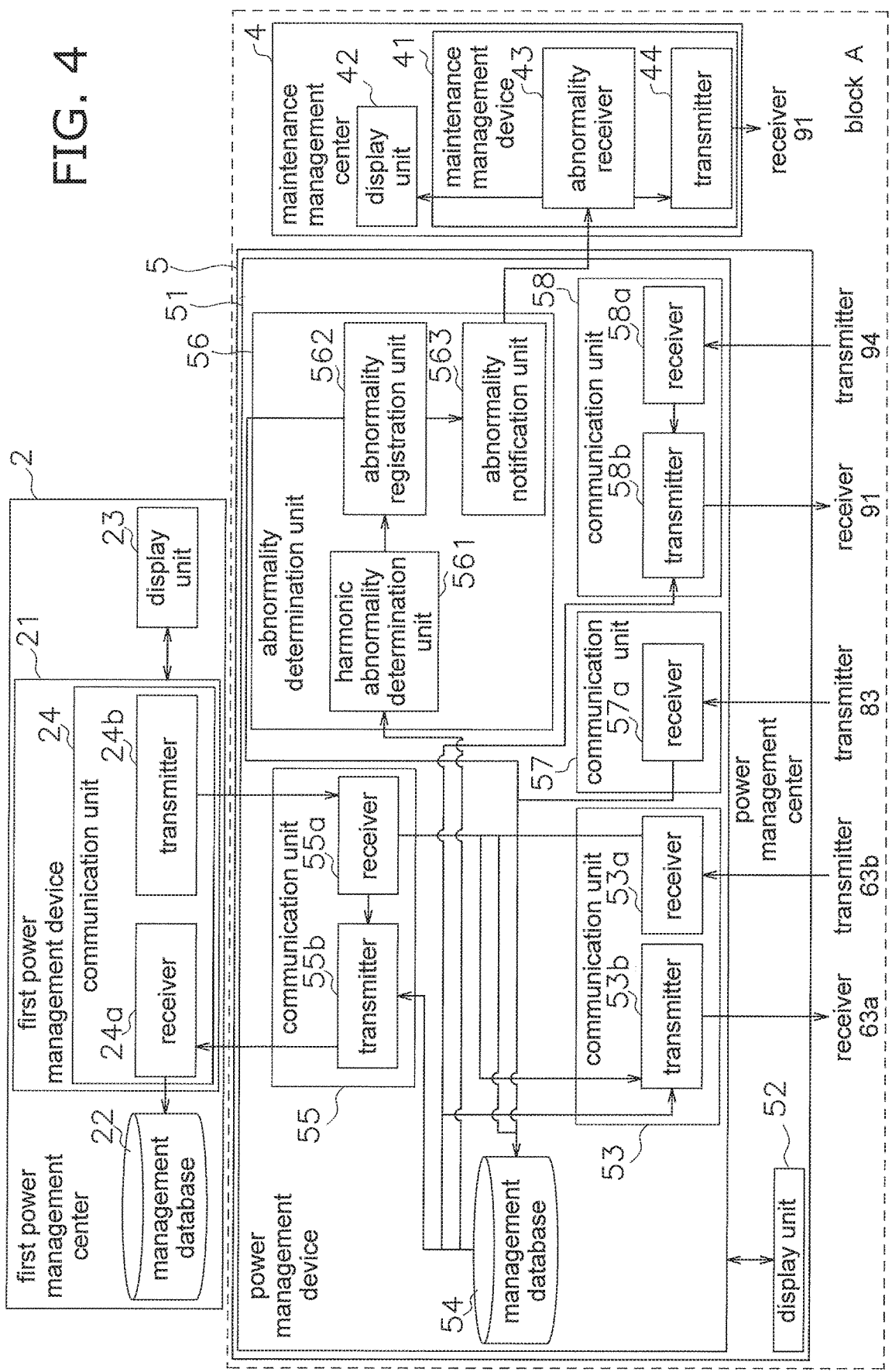
FIG. 4 is a block diagram of the configurations of the first power management center and second power management center in FIG. 1.

FIG. 4 is a block diagram of the configurations of the first power management center 2 and the power management center 5. As shown in FIG. 4, the power management device 51 has a communication unit 53, a management database 54, a communication unit 55, an abnormality determination unit 56, a communication unit 57, and a communication unit 58.

The communication unit 53 communicates with the data collection relay 6. The communication unit 53 has a receiver 53*a* and a transmitter 53*b*. As shown in FIG. 1, the receiver 53*a* receives the sensor ID, time information, detection data, and relay management code transmitted from the transmitters 63*b* of the plurality of data collection relays 6. The transmitter 53*b* transmits a setting request and a data acquisition request to each data collection relay 6.

The management database 54 stores the relay management code, sensor ID, time information, and detection data received through the receiver 53*a*. As described above, since the detection data is transmitted from the CT sensor 7 to the data collection relay 6 every six minutes, if a data acquisition request is transmitted to the data collection relay 6 every 60 minutes, the detection data for 10 times will be transmitted all at once from the data collection relay 6 to the power management device 51. The management database 54 stores this detection data (the values (dB) of the power spectrum of the fundamental wave, the third harmonic, and the fifth harmonic) in a table along with the sensor ID, time information, relay management code, and area code.

The management database 54 also stores thresholds for detecting an abnormality, as well as detection result data (whether or not there is an abnormality and the degree of abnormality). The management database 54 also stores and updates the setting information received from the first power management center 2.

The communication unit 55 communicates with the first power management center 2. The communication unit 55 has a receiver 55*a* and a transmitter 55*b*. The receiver 55*a* receives setting information from the first power management center 2. The transmitter 55*b* transmits the detection result data to the first power management center 2.

The abnormality determination unit 56 detects harmonics in the power distribution network on the basis of the detection data stored in the management database 54. The abnormality determination unit 56 has a harmonic abnormality determination unit 561, an abnormality registration unit 562, and an abnormality notification unit 563.

The harmonic abnormality determination unit 561 detects whether or not the current supplied through the distribution line includes a harmonic component. The harmonic abnormality determination unit 561 uses the values (dB) of the power spectrum of the fundamental wave, the third harmonic, and the fifth harmonic of the current in the detection data to detect whether or not the fundamental wave includes a third harmonic or a fifth harmonic. A harmonic abnormality can be determined from the values (dB) of the power spectrum of the fundamental wave, the third harmonic, and the fifth harmonic of the current of each of the CT sensors 7 shown in FIG. 2.

The abnormality registration unit 562 registers detection result data (whether or not there is an abnormality and the degree of the abnormality) determined by the harmonic abnormality determination unit 561, in the management database 54 along with the relay management code and the sensor ID.

The abnormality notification unit 563 notifies the maintenance management center 4 of the detection result data registered by the abnormality registration unit 562.

The communication unit 57 communicates with the smart meter 8. The communication unit 57 has the receiver 57a that receives the meter ID or the amount of power from the transmitter 83 of the smart meter 8.

The communication unit 58 communicates with the smartphone 9. The communication unit 58 has the receiver 58a and the transmitter 58b. The receiver 58a receives a power usage fee inquiry transmitted from the transmitter 94 of the smartphone 9. The transmitter 58b transmits to the smartphone 9 the power usage fee or a warning message based on the detection result.

Maintenance Management Center

The maintenance management center 4 performs maintenance management of the power distribution network 100 on the basis of the notification of the abnormality detection result data from the power management center 5. That is, management such as dispatching a worker to make actual confirmation is performed at the installation location of the CT sensor 7 that has transmitted detection data in which an abnormality has been detected. As shown in FIG. 1, the maintenance management center 4 has a maintenance management device 41 and a display unit 42. As shown in FIG. 2, the maintenance management device 41 has an abnormality receiver 43 and a transmitter 44. The abnormality receiver 43 receives the detection result data transmitted from the abnormality notification unit 563 of the power management device 51. The display unit 42 displays the detection result data, and the manager takes measures such as dispatching a worker to the site if needed. When the abnormality receiver 43 receives the detection result data, and there is a user registration in the smart meter 8 corresponding to the CT sensor 7 that has detected a harmonic, the transmitter 44 transmits a warning message to the transmission destination indicated by the registration information of that user.

First Power Management Center and Second Power Management Center

As shown in FIG. 1, the first power management center 2 has a first power management device 21, a management database 22, and a display unit 23. As shown in FIG. 4, the first power management device 21 has a communication unit 24 provided with a receiver 24a and a transmitter 24b, and communicates with the power management center 5 provided in each of the blocks. The first power management device 21 uses the communication unit 24 to receive the detection result data obtained by each power management device 51, and stores the data in the management database 22.

The detection result data includes whether or not there is an abnormality and the warning level of the abnormality, and the power management device 51 adds the ID and position of the CT sensor 7 that measured the measurement data in which the abnormality was detected, the management code of the data collection relay 6, the ID of the smart meter 8, the registration information of the user, the measurement time of the measurement data in which an abnormality was detected, and so forth to the detection result data, and transmits the result to the first power management device 21.

Thus leaving a record of abnormality detection in the management database 22 makes it possible for the host power management centers 2 and 3 to take measures.

The second power management center 3 is configured the same as the first power management center 2, and as shown in FIG. 1, has a second power management device 31 having a communication unit provided with a transmitter and a receiver, a management database 32, and a display unit 33. The second power management center 3 communicates with the power management center 5 provided in another block, and stores detection result data produced by the power management center 5.

Operation

The operation of the harmonic detection system 1 in an embodiment of the present invention will now be described.

Operation of CT Sensor

Figure 5:
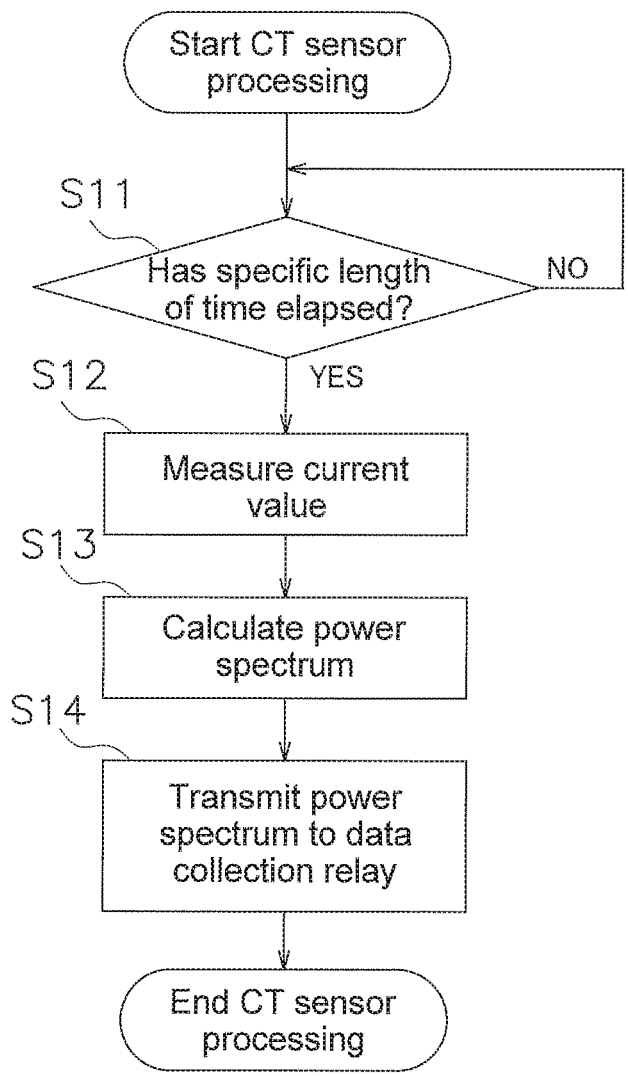
FIG. 5 is a flowchart of the operation of a CT sensor in the harmonic detection system in FIG. 1.

FIG. 5 is a flowchart of the operation of the CT sensor 7 of the harmonic detection system 1 in this embodiment.

When processing commences, once a specific charging time has elapsed in step S11, in step S12 power is supplied from the power supply unit 72 and the measurement component 71 measures the current of the distribution line. The specific charging time can be set, for example, to six minutes, in which case current measurement is performed every six minutes.

Next, in step S13 the measurement component 71 calculates the power spectrum. Values are determined for the power spectrum of the fundamental wave, the third harmonic, and the fifth harmonic.

Next, in step S14 the calculated values for the power spectrum of the fundamental wave of the current, the third harmonic, and the fifth harmonic, the measurement time, and the sensor ID are transmitted from the transmitter 73 to the data collection relay 6, and the processing of the CT sensor 7 ends.

Operation of Data Relay

Figure 6:
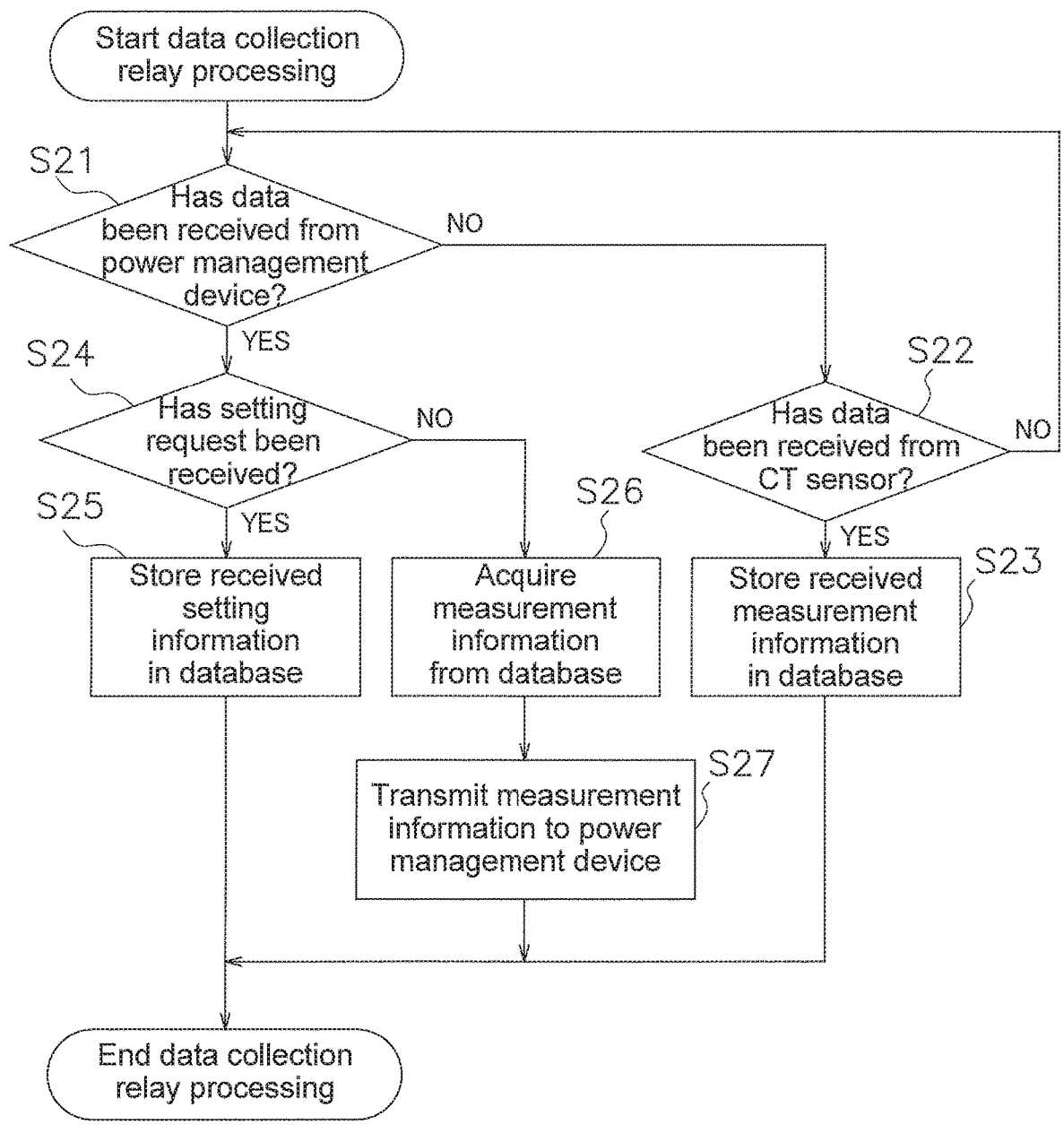
FIG. 6 is a flowchart of the operation of the data collection relay in the harmonic detection system in FIG. 1.

FIG. 6 is a flowchart of the operation of the data collection relay 6 of the harmonic detection system 1 in this embodiment.

When the processing commences, in step S21 the data collection relay 6 determines whether or not data has been received from the power management device 51 via the communication unit 63.

If no data has been received from the power management device 51, it is determined in step S22 whether or not data has been received from the CT sensor 7. If data has been received, in step S23 the data collection relay 6 stores the received measurement information in the management database 62, and the processing of the data collection relay 6 ends.

On the other hand, if data has been received from the power management device 51 in step S21, it is determined in step S24 whether or not a setting request has been received. If a setting request has been received, in step S25 the received setting request is stored in the management database 62, and the processing of the data collection relay 6 ends.

On the other hand, if no setting request has been received in step S24, then data acquisition request has been transmitted from the power management device 51, so the data collection relay 6 acquires measurement information from the management database 62. Then, in step S27 the data collection relay 6 transmits the measurement information to the power management device 51, and the processing of the data collection relay 6 ends.

Here, the sensor ID, measurement time, and detection data are transmitted from the plurality of CT sensors 7 to the data collection relay 6 at six-minute intervals, for example, and the sensor ID, measurement time, and detection data are stored in association with one another as a database in the management database 62 of the data collection relay 6.

Figure 7:
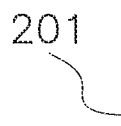
FIG. 7 is a setting information table stored in the management database of the data collection relay in FIG. 3.

FIG. 7 shows a setting information table 201 stored in the management database 62, and FIG. 8 shows a measurement information table 202 stored in the management database 62. As shown in FIG. 7, the management code (A01_01) of the data collection relay 6, the IDs (001, 002 to 00n) of the CT sensors 7, and time information are recorded in the setting information table 201. The setting information table 201 stores and updates the setting information received from the power management device 51. Also, as shown in FIG. 8, the IDs (01, 002 to 00n) of the CT sensors 7, the measurement time, and detection data of the CT sensors 7 (the power spectrum values (dB) of the fundamental wave of the current, the third harmonic, and the fifth harmonic) are stored in association with each other in the measurement information table 202. Thus, the management database 62 stores detection data and the time at which that data was measured for each CT sensor 7. The measurement information table 202 is updated whenever detection data is received from a CT sensor 7.

Operation of Smart Meter

Figure 9:
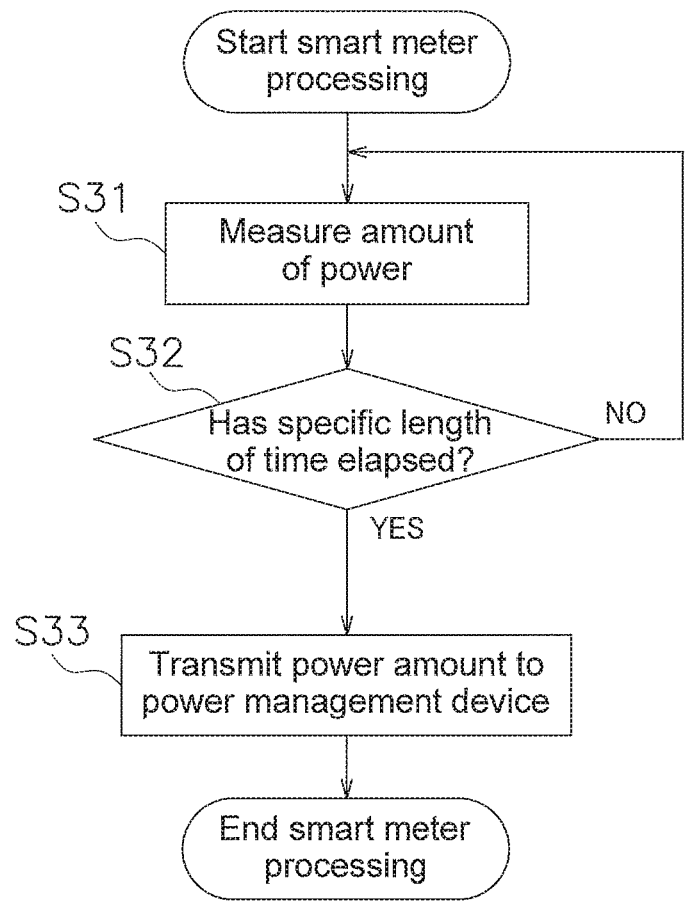
FIG. 9 is a flowchart showing the operation of the smart meter in FIG. 1.

FIG. 9 is a flow chart showing the operation of the smart meter 8.

The smart meter 8 measures the amount of power in step S31, and the measurement of the amount of power is repeated until it is determined in step S32 that a predetermined time has been reached. That is, the amount of power is measured until the predetermined time has elapsed. Here, the predetermined time may be 24 hours, for example.

In step S32, when the predetermined time has elapsed, in step S33 the transmitter 83 transmits the amount of power to the receiver 57a of the power management device 51.

Operation of Power Management Device

Figure 10:
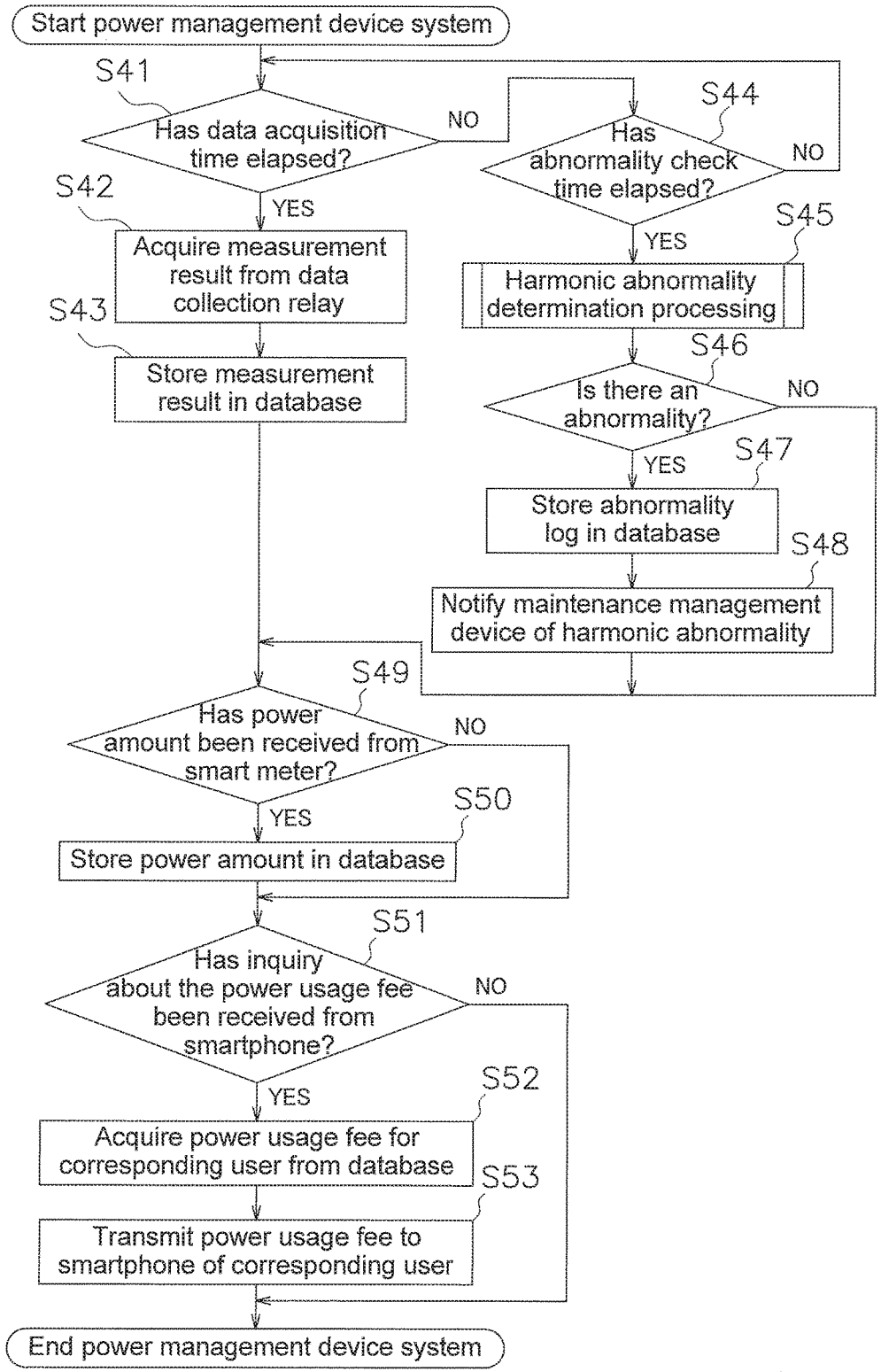
FIG. 10 is a flowchart showing the operation of the power management device of the harmonic detection system in FIG. 1.

FIG. 10 is a flowchart of the operation of the power management device 51 of the harmonic detection system 1 in this embodiment.

In step S41, the power management device 51 determines whether or not a data acquisition time has elapsed. In this embodiment, the data acquisition time is set every 60 minutes, for example.

Since the measurement information from the data collection relay 6 is acquired if 60 minutes have elapsed, in step S42 the power management device 51 transmits a data acquisition request from the transmitter 53b to the data collection relay 6.

Upon wirelessly receiving the data acquisition request from the power management device 51, the data collection relay 6 transmits the measurement information stored in the management database 62 to the power management device 51 via the transmitter 53b.

Upon receiving the measurement information from the data collection relay 6, in step S43 the power management device 51 stores the measurement information in the management database 54. The table stored in the management database 54 will now be described.

FIG. 11 shows a setting information table 203 stored in the management database 54, and FIG. 12 shows a measurement information table 204 stored in the management database 54. FIG. 13 shows a position information management table 205 stored in the management database 54. FIG. 14 shows a user management table 206 stored in the management database 54.

As shown in FIG. 11, area codes (such as the areas A-1, A-2, etc., in FIG. 1), the management code (A01_01) of the data collection relay 6, the group ID, the classification ID, the ID (001, 002 to 00n) of the CT sensors 7, the meter ID and time information are recorded in the setting information table 203. Here, the area code identifies each area. The relay management code identifies the data collection relay 6. The group ID indicates the type of trunk line on which a CT sensor 7 is installed, and indicates whether it is installed on a distribution line of R phase, S phase, or T phase. The classification ID indicates whether a CT sensor 7 is installed on a trunk line or a branch line, with BR00 indicating that the CT sensor 7 is installed on a trunk line, and BR01 that it is installed on a branch line. The meter ID is assigned when the user is registered, and one meter ID does not correspond to the sensor IDs of the plurality of CT sensors 7, but corresponds to the sensor ID of one CT sensor 7. If the user is not registered, no meter ID is assigned. Situations in which a meter ID has not been assigned include, for example, when the CT sensor 7 is disposed on a distribution line in which there is no specific user G (such as distribution lines 103, 104, and 105, which are trunk lines).

The power distribution network 100 shown in FIG. 2 will be described as an example. The power distribution network 100 shown in FIG. 2 is provided in the area A01, and the management code of the data collection relay 6 installed on the power pole 101 is A01_01, and the management code of the data collection relay 6 installed on the power pole 102 is A01_02. In this case, if we assume that the sensor ID of the CT sensor 7 installed on the distribution line 106 is 003, since the distribution line 106 is a branch from the T-phase distribution line 105, the group ID is set to R and the classification ID is set to BR01. The meter ID (sm000) indicates the ID of the smart meter 8 provided to the house 109 into which the distribution line 106 is run.

As shown in FIG. 12, an area code, a relay management code, IDs (001, 002 to 00n) of each CT sensor 7, time information indicating the measurement time, and detection data for each CT sensor 7 (the values (dB) of the power spectrum of the current fundamental wave, the third harmonic, and the fifth harmonic) are stored in association with each other in the measurement information table 204.

As shown in FIG. 13, position information about the CT sensors 7 installed in the area code is managed in the position information management table 205. The area code, the relay unit management code, the CT sensor ID, and the position code are stored in association with each other in the position information management table 205. The position code can be used to confirm the location at which the corresponding CT sensor 7 is installed.

As shown in FIG. 14, the contact point of the smartphone 9 owned by the user G is registered as registration information in the user management table 206. The meter ID indicates identification information about the smart meter 8 as mentioned above, and the user ID is identification information about the user G at the consumer D whose power amount is being measured by the smart meter 8. The registration number is a contact point of the smartphone 9 owned by the user G. For example, a telephone number or an email address is registered. With this user management table 206, it is possible to associate the smart meter 8, a user in a house, a factory, or another such consumer where the smart meter 8 is installed, and the user's contact address can be associated with each other.

That is, as shown in FIG. 11, since the sensor ID of the CT sensor 7 and the meter ID of the smart meter 8 are in a one-to-one correspondence, the CT sensor 7 can be linked to the user at the consumer location into which the distribution line whose current is being measured by the CT sensor 7 is run. Consequently, when a harmonic is detected by a specific CT sensor 7, the contact address of the user corresponding to that CT sensor 7 will be known.

The setting information table 203 is updated by storing the setting information set by the power management device 51. Also, the measurement information table 204 is updated when measurement information is received from the data collection relay 6. The position information management table 205 is updated when a new CT sensor 7 is installed, or when the installation location of the CT sensor 7 is changed. The user management table 206 is updated when the user is changed, when a smart meter 8 is newly installed, or the like.

In step S41 described above, if the data acquisition time has not elapsed, it is checked in step S44 whether or not the power management device 51 has exceeded the abnormality check time. The interval of this abnormality check can be set, for example, to an interval of 60 minutes.

If the abnormality check time has passed, in step S45 harmonic abnormality determination processing is performed. The abnormality determination processing of the distribution line will be described in detail below. If the abnormality check time has not passed, the processing goes back to step S41.

Next, in step S46 it is determined whether or not there is an abnormality. If there is an abnormality, an abnormality log is recorded in the management database 54 in step S47. Then, in step S48 the abnormality notification unit 563 notifies the maintenance management device 41 of a harmonic abnormality.

FIG. 15 is a diagram of an abnormality management table 207, which is an abnormality log recorded in the management database. In the abnormality management table 207, an area code (A01), relay management codes (A01_01 to A01_0n, A02_01, . . . ), CT sensor IDs (001, . . . ), states, and the level of the harmonic are recorded. The "state" indicates normal or abnormal, and the level of the harmonic is indicated by three warning levels in the case of abnormal.

As shown in FIG. 10, after step S43, after step S48, or when no abnormality is detected in step S46, control proceeds to step S49.

In step S49, the power management device 51 determines whether or not the receiver 57a has received the power amount from the smart meter 8. If the power amount has been received in step S49, the power management device 51 stores the received power amount in the management database 54 in step S50.

Next, in step S51, the power management device 51 determines whether or not the receiver 58a has received an inquiry about the power usage fee from the smartphone 9.

If a power usage fee inquiry has been received in step S51, in step S52 the power management device 51 acquires the power usage fee for corresponding user from the management database 54.

Next, in step S53 the power management device 51 transmits the power usage fee to the smartphone 9 of the corresponding user G.

Figure 16:
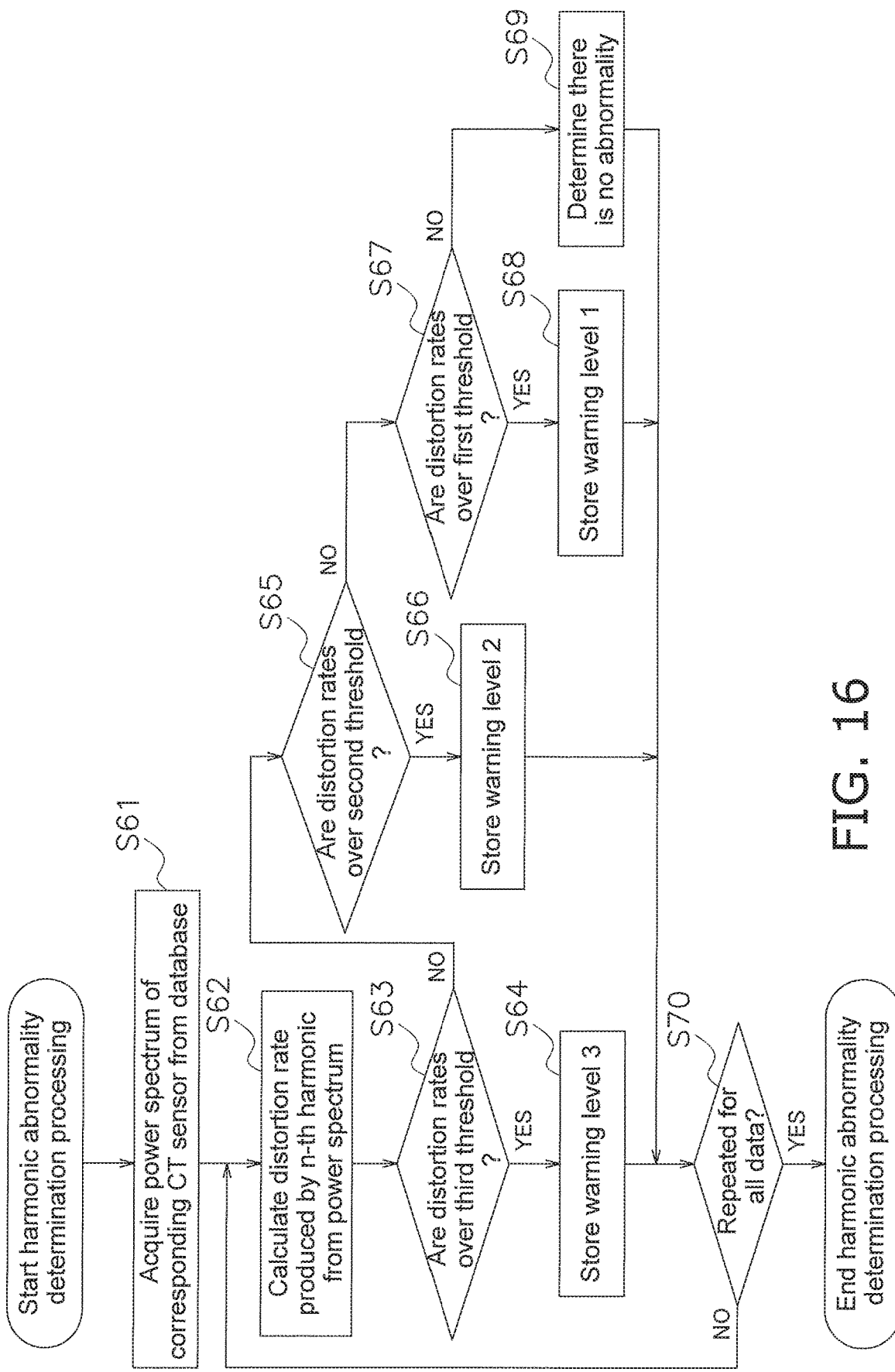
FIG. 16 is a flowchart of harmonic abnormality determination processing in the abnormality determination processing in FIG. 10.

The abnormality determination processing for the distribution line performed in step S45 will now be described.
Harmonic Determination Processing FIG. 16 is a flowchart of the harmonic determination processing of step S45 in FIG. 10.

Figure 17:
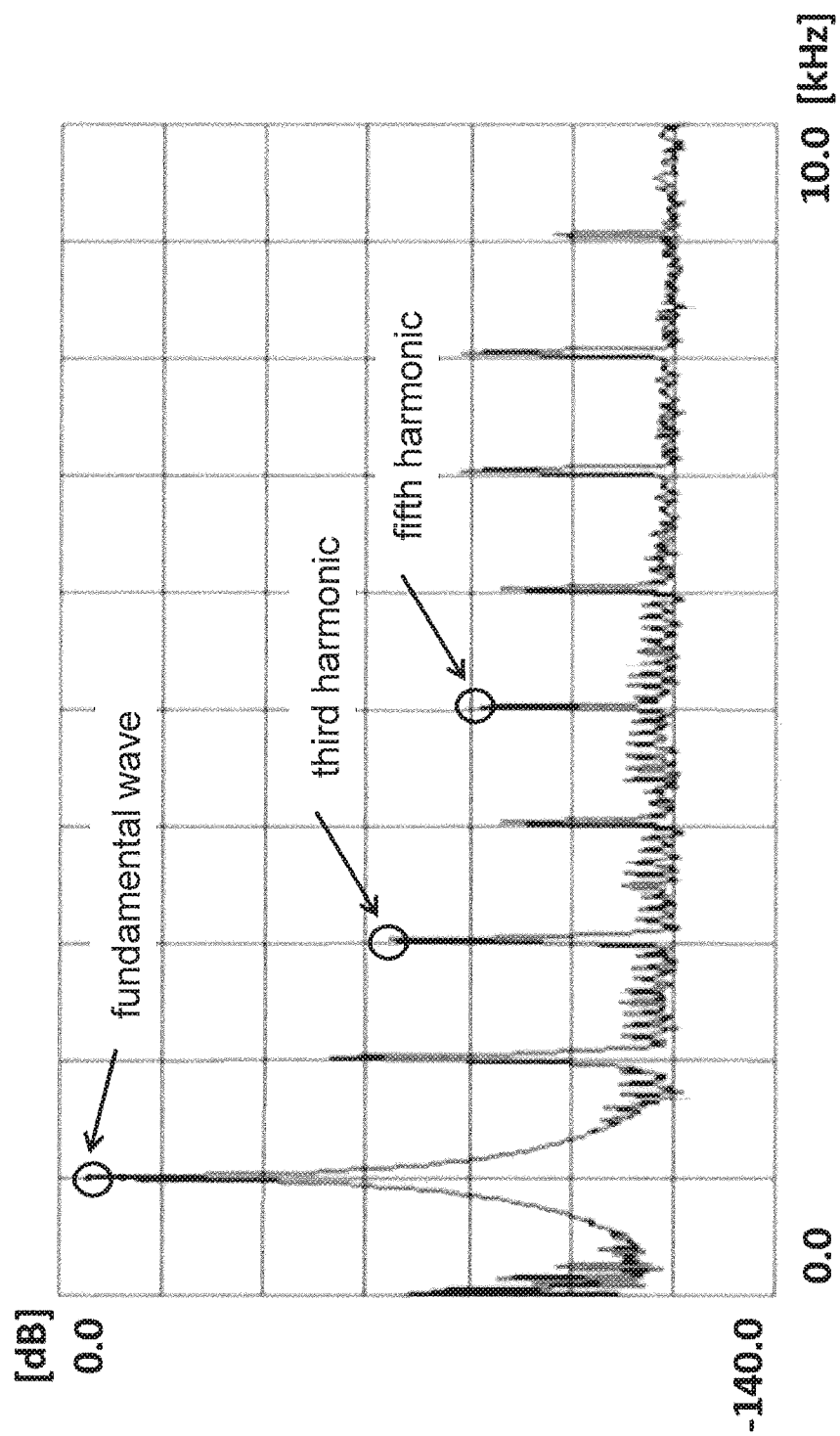
FIG. 17 is a graph of the power spectrum calculated by a CT sensor.

In step S61, the harmonic abnormality determination unit 561 of the abnormality determination unit 56 acquires the power spectrum of the corresponding CT sensor 7 from the management database 54. In harmonic abnormality determination, the power spectrums are acquired for all the CT sensors 7. The power spectrum is calculated from the current waveform in the measurement component 71 of the CT sensor 7, and the harmonic abnormality determination unit 561 acquires the power spectrum of the fundamental wave, the third harmonic, and the fifth harmonic. FIG. 17 is a diagram showing a power spectrum graph.

Next, in step S62 the harmonic abnormality determination unit 561 calculates the distortion rate (also referred to as the harmonic content rate) produced by the n-th harmonic from the power spectrum. The harmonic abnormality determination unit 561 uses the power spectrum [dB] of the fundamental wave, the third harmonic, and the fifth harmonic to calculate the harmonic content rate for each frequency (the ratio of the harmonic power spectrum of a harmonic of a specific order to the power spectrum of the fundamental wave). If we let a[dB] be the power spectrum of the fundamental wave, and n[dB] be the power spectrum of the n-th harmonic (b3 for the third harmonic and b5 for the fifth harmonic), the distortion rate can be found from the following Formula 1.

$$\text{distortion rate} = 10^{((bn/a)/20)} \times 100(\%), n=3, 5 \qquad \text{Formula 1:}$$

The distortion rate produced by the third harmonic and the distortion rate produced by the fifth harmonic are calculated in this way.

Next, in step S63 the harmonic abnormality determination unit 561 determines whether or not the two calculated distortion rates are over a third threshold set for each. Here, the management database 54 stores first thresholds, second thresholds, and third thresholds that have been preset for each of the third harmonic and the fifth harmonic. The values are set to increase in the order of the first thresholds, the second thresholds, and the third thresholds, and the warning level increases in order.

In step S63, if the harmonic abnormality determination unit 561 determines that either of the two calculated distortion rates is over the third threshold, then in step S64 the abnormality registration unit 562 stores that the warning level is 3.

Also, if neither of the distortion rates is over the third threshold in step S63, the harmonic abnormality determination unit 561 determines whether or not the two distortion rates are over the second threshold set for each in step S65.

In step S65, if it is determined by the harmonic abnormality determination unit 561 that either of the two calculated distortion rates is over the second threshold, then in step S66 the abnormality registration unit 562 stores that the warning level is 2.

If neither of the two distortion rates is over the second threshold in step S65, the harmonic abnormality determination unit 561 determines in step S67 whether or not the two distortion rates are over the first distortion threshold set for each.

In step S67, if it is determined by the harmonic abnormality determination unit 561 that either of the two calculated distortion rates is over the first threshold, then in step S68 the abnormality registration unit 562 stores that the warning level is 1.

Also, in step S67, if neither of the two distortion rates is over the first threshold, the harmonic abnormality determination unit 561 determines in step S69 that there is no abnormality.

After the above steps S64, S66, S68, and S69, the processing proceeds to step S70. Steps S61 to S69 are repeated until determination of abnormality has been performed for all the data acquired in order to determine harmonic abnormality.

Figure 18:
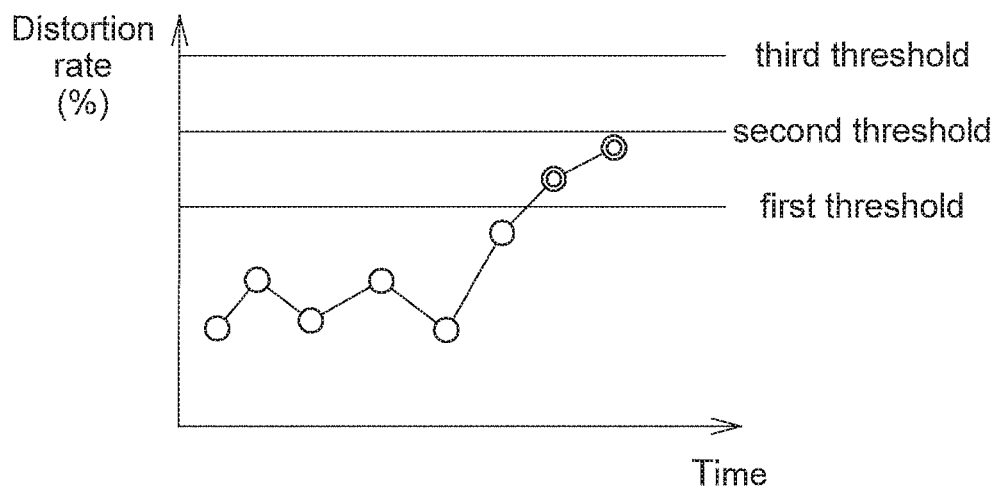
FIG. 18 is a graph of the change over time in the harmonic current content rate.

FIG. 18 is a graph of the change over time in the distortion rate. The data indicated by a double circle in the graph is understood to be warning level 1 because it lies between the first threshold and the second threshold.

As described above, when a harmonic is detected and there is a harmonic (step S46), in step S47 the abnormality registration unit 562 causes the abnormality management table 207 shown in FIG. 15 to store an abnormality log in the management database 54.

Operation of Maintenance Management Device

Figure 19:
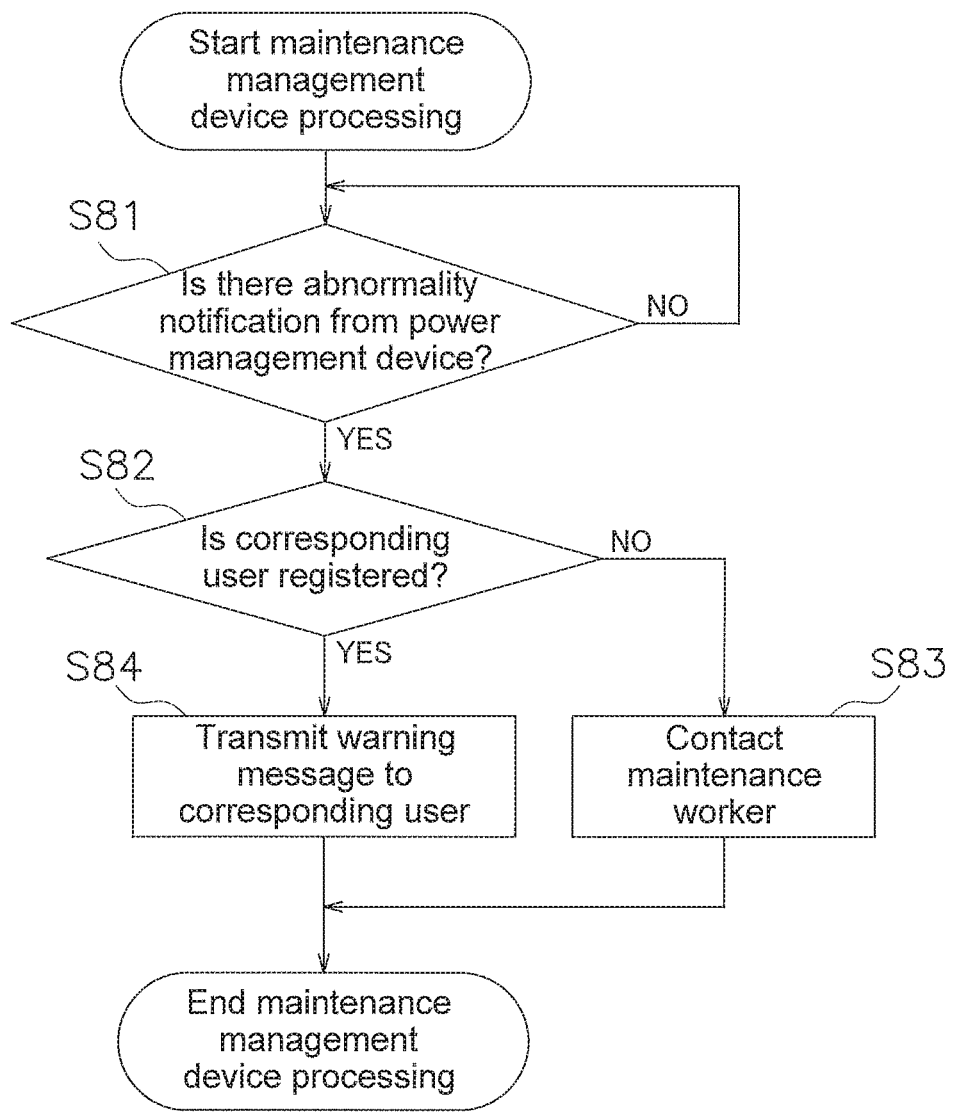
FIG. 19 is a flowchart of the operation of the maintenance management device in FIG. 4.

Next, the operation of the maintenance management device 41 will be described. FIG. 19 is a flowchart of the operation of the maintenance management device 41.

In step S81, the maintenance management device 41 determines whether or not there is an abnormality notification from the power management device 51. If there is an abnormality notification, it is determined in step S82 whether or not the corresponding user is registered.

Here, the power management device 51 sends the maintenance management device 41 the area code, the relay management code, the sensor ID, the state, the level of the harmonic (see the abnormality management table 207), the meter ID corresponding to the sensor ID (see the setting information table 203), the user ID and the registration number corresponding to the meter ID (user management table 206), and the position code (position information management table 205). Since no meter ID is assigned to the setting information table 203 when user registration has not been performed, the maintenance management device 41 can conclude that the user is not registered.

If there is no registration for the corresponding user in step S82, a maintenance worker is notified in step S83. Consequently, the maintenance worker can visit the installation location (specified by the position code) of the CT sensor 7 that has detected the harmonic, and the cause of the high frequency can be examined and dealt with.

Figure 20:
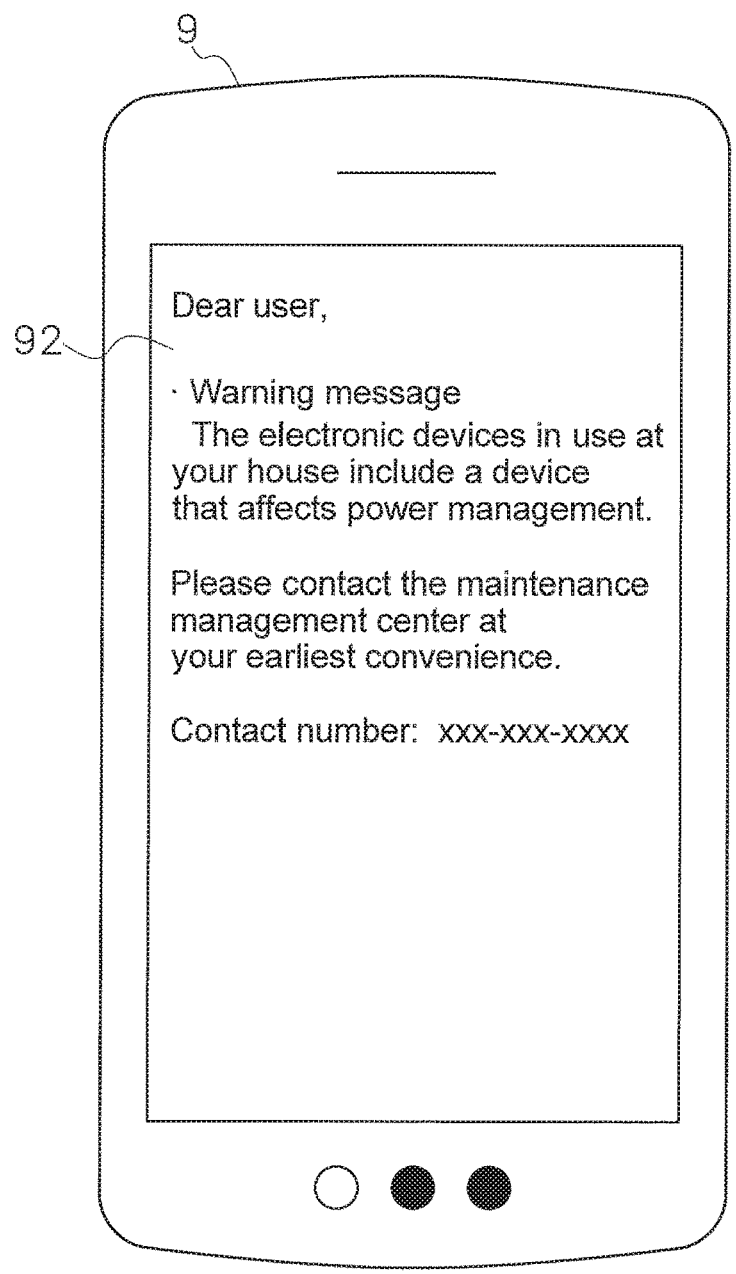
FIG. 20 shows a state in which a warning message is displayed on the smart phone in FIG. 3.

On the other hand, if there is registration of the corresponding user in step S82, the maintenance management device 41 transmits a warning message (an example of a notification) addressed to the registration number of the user as the transmission destination in step S84. FIG. 20 shows a state in which a warning message is displayed on the display unit 92 of the smartphone 9 owned by the user.

This allows the user G to check the warning message can take measures.

Other Embodiments

An embodiment of the present invention was described above, but the present invention is not limited to or by the above embodiment, and various modifications are possible without departing from the gist of the invention.

(A)

In the above embodiment, the warning message (an example of a notification) is displayed on the smartphone 9 as an example of the notification device, but the smartphone 9 is not the only option, and the message may be displayed on a television, a personal computer, or the like.

(B)

In the above embodiment, the warning message is sent from the transmitter 44 (an example of a first transmitter) to the smartphone 9, but this is not the only option, and the power management device 51 may send the warning message to the smartphone 9. In this case, a warning message can be displayed on the smartphone 9 from the transmitter 58b (an example of a first transmitter) of the power management device 51, and the transmitter 58b corresponds to an example of a first transmitter.

(C)

In the above embodiment, when a harmonic is detected, the user G is notified with a warning message of the occurrence of an abnormality in the distribution line, but the invention is not limited to a warning message. For example, sound, light, or the like may be used, so long as the user G is somehow notified that an abnormality has occurred.

(D)

In the above embodiment, the contact points of the CT sensor 7 and the user G are linked via the meter ID of the smart meter 8, but this is not the only option, and the contact address of the user G at the time of installation of the CT sensor 7 may also be set in the management database 54. What is important is that, when a harmonic is detected, the contact address of the user G of the power flowing through the distribution line on which is installed a CT sensor 7 where a harmonic was detected can be reached from that CT sensor 7.

(E)

In the above embodiment, the power management device 51 was described as being provided in units such as a prefecture, for example, but this is not the only option, and may be provided in units of a zone transmitted from a specific substation, or of a municipal section such as a city or a town. Also, the power management device 51 may be provided to a cubicle, for example.

(F)

With the harmonic detection system 1 in the above embodiment, the measurement information of the CT sensor 7 is temporarily collected by the data collection relay 6 and then transmitted to the power management device 51, but this is not the only option.

For instance, the data collection relay 6 may not be provided to the harmonic detection system 1, in which case the measurement information is transmitted wirelessly, directly from the CT sensor 7 to the power management device 51.

(G)

With the harmonic detection system 1 in the above embodiment, the power spectrum is calculated by the CT sensor 7, and processing to detect a harmonic abnormality is performed from the power spectrum by the power management device 51, but this is not the only option.

For example, the power spectrum may be calculated by the CT sensor 7, and processing to detect a harmonic abnormality may be performed by the data collection relay 6. Also, this may be performed until processing to detect a harmonic abnormality by the CT sensor 7.

Also, for example, some or all of the current waveform data detected by the CT sensor 7 may be transmitted to the data collection relay 6, and the data collection relay 6 may calculate the power spectrum of the current. Furthermore, the data collection relay 6 may calculate the power spectrum, and processing to detect a harmonic abnormality may be performed from this power spectrum.

Furthermore, the power spectrum of the current may not be calculated in the CT sensor 7 and the data collection relay 6, and instead the power spectrum may be calculated in the power management device 51, and the harmonic abnormality detection processing may be performed from this power spectrum.

(H)

In the above embodiment, the content rate of the third harmonic and the fifth harmonic with respect to the fundamental wave is calculated, but just one or the other may be used instead. Furthermore, the harmonic abnormality determination unit 561 may detect harmonics by calculating the content rate of seventh and higher harmonics.

(I)

In the above embodiment, the distortion rate is calculated using Formula 1, and it is determined that a harmonic is included when the distortion rate exceeds a predetermined threshold value, but this is not the only option, and it is only necessary to be able to detect that the fundamental wave contains a harmonic.

For instance, it may be determined that the n-th harmonic is included when the power spectrum value (dB) of the n-th harmonic (n=3, 5, 7, etc.) is at or over a predetermined threshold.

Also, it may be determined that the n-th harmonic is included when the ratio of the effective value of the n-th harmonic to the effective value of the fundamental wave is at or over a predetermined threshold.

(J)

In the above embodiment, the power management device 51 is provided with the abnormality determination unit 56, and abnormalities are determined by the power management device 51, but this is not the only option.

(J-1)

Figure 21:
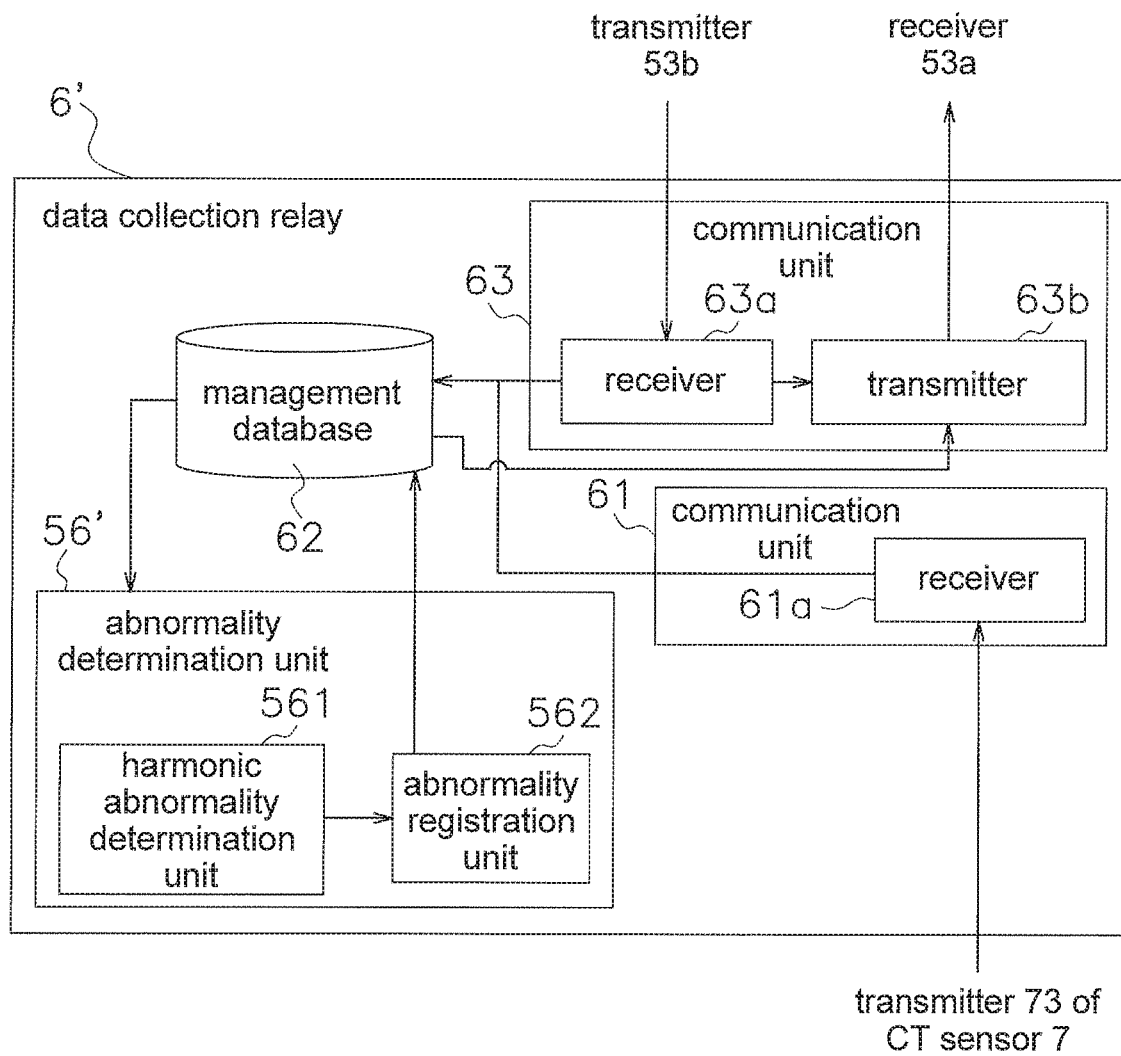
FIG. 21 is a block diagram of the configuration of a modification example of a data collection relay.

For instance, as shown in FIG. 21, a data collection relay 6' may be provided with an abnormality determination unit 56' having the harmonic abnormality determination unit 561 and the abnormality registration unit 562, and abnormalities may be determined by the data collection relay 6'.

Furthermore, just the detection result data for abnormalities detected by the data collection relay 6' may be transmitted from the data collection relay 6' to the power management device 51. This abnormality detection result data is, for example, data indicating the state shown in FIG. 15 (whether or not there is an abnormality, the level of abnormality). The power management device 51 stores abnormality detection result data in the management database 54 in association with the relay management code (an example of identification information of relay) and the sensor ID (an example of identification information of measuring instrument).

(J-2)

Figure 22:
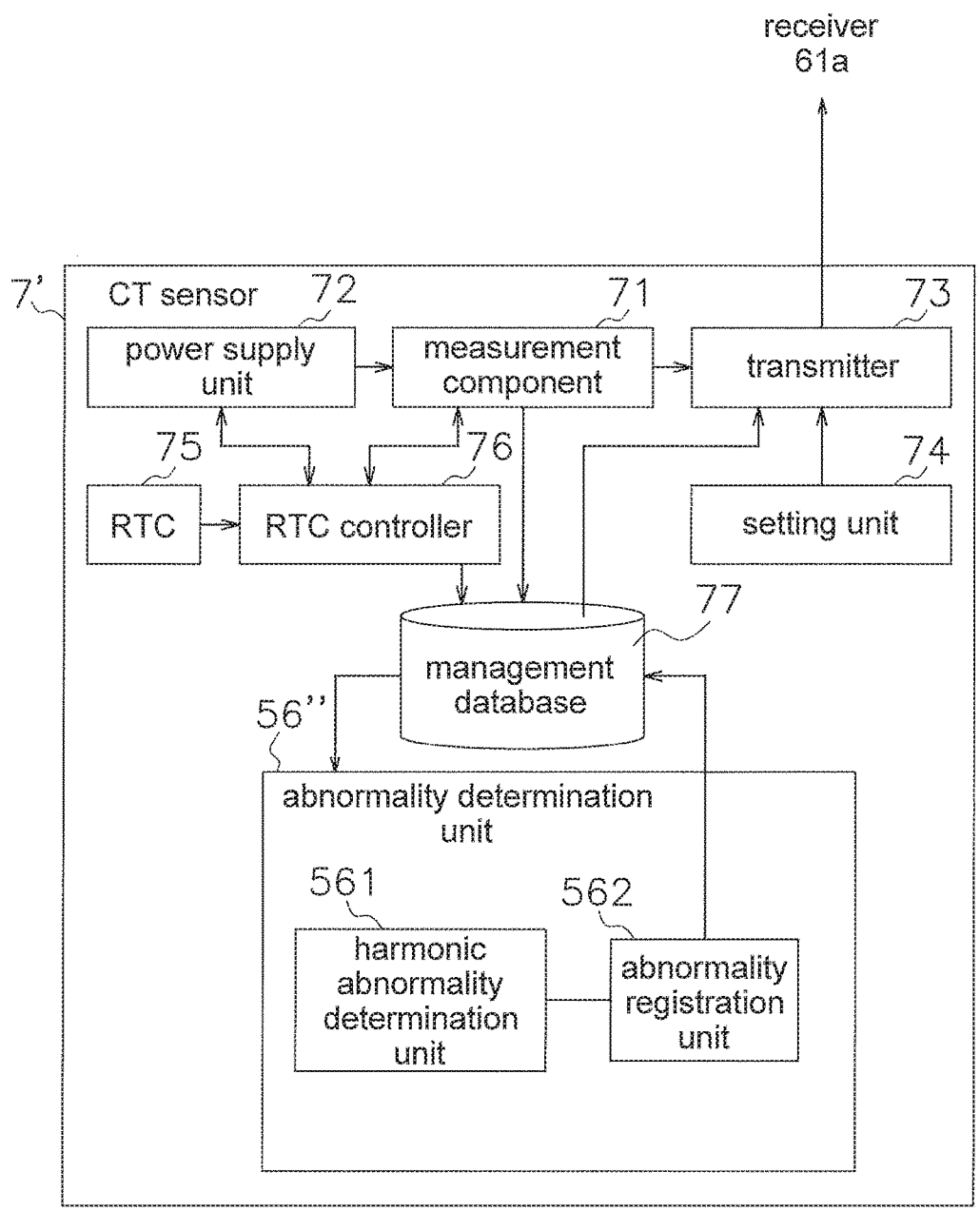
FIG. 22 is a block diagram of the configuration of a modification example of a CT sensor.

Also, the CT sensor 7 may be provided with the harmonic abnormality determination unit 561 so that the CT sensor 7 performs abnormality determination. The CT sensor 7' of such a configuration is shown in FIG. 22. The CT sensor 7' is provided with an abnormality determination unit 56" having the harmonic abnormality determination unit 561 and the abnormality registration unit 562, and a management database 77.

The abnormality determination unit 56" determines an abnormality, and the detection result data for that abnormality is stored in the management database 77 along with time information.

The data collection relay 6 and the power management device 51 then store the detection result in association with the sensor ID and the time information.

(K)

In the above embodiment, the RTC 75 and the RTC controller 76 are provided to the CT sensor 7, but the RTC 75 and the RTC controller 76 need not be provided to the CT sensor 7, and the RTC 75 and the RTC controller may be provided to the data collection relay 6. That is, although time information is transmitted from the CT sensor 7 to the data collection relay 6 in the above embodiment, this is not the only option, and time information may be added when the data collection relay 6 receives data from the CT sensor 7.

Figure 23:
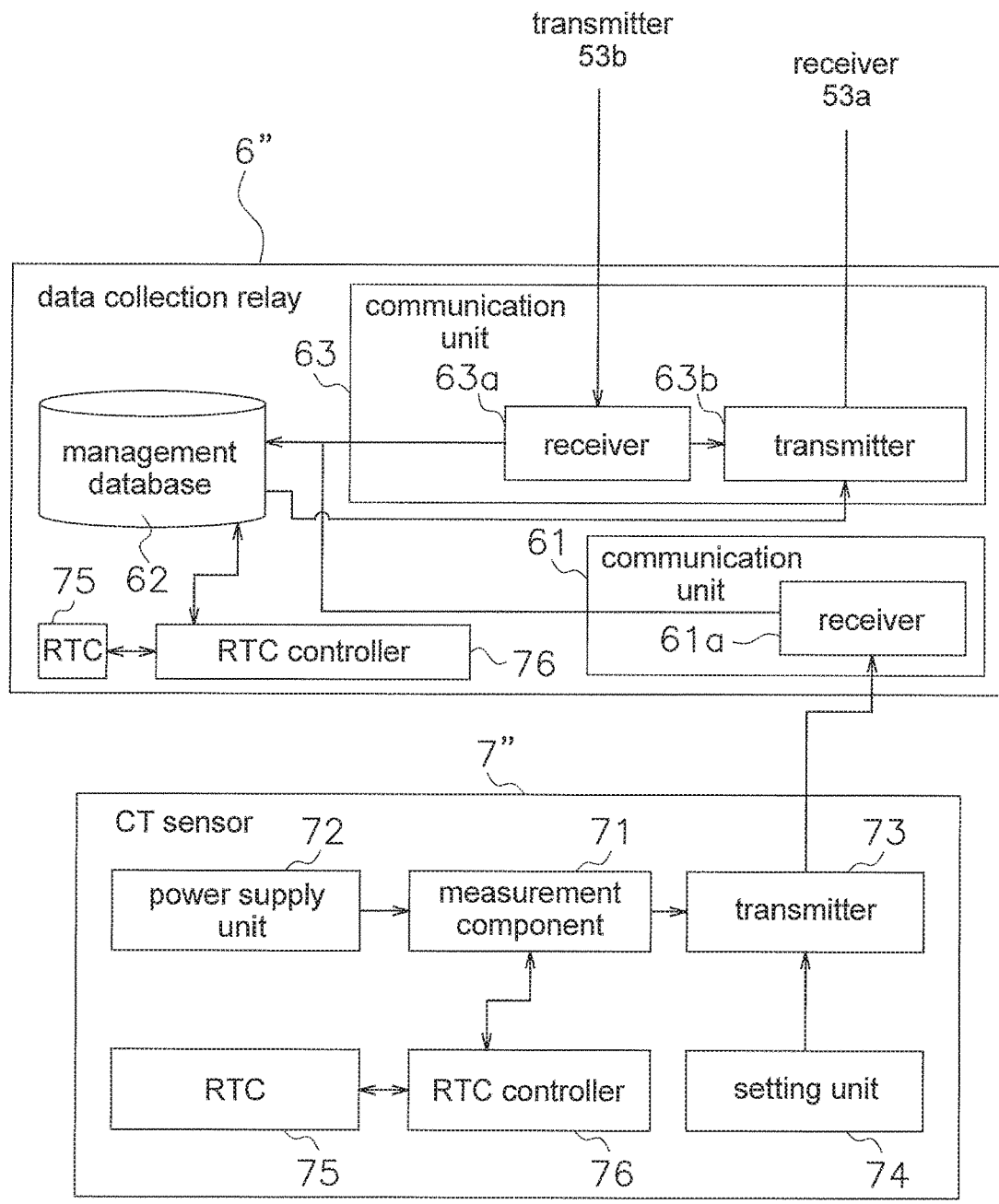
FIG. 23 is a block diagram of the configuration of a modification example of a data collection relay and a CT sensor.

FIG. 23 is a block diagram of a CT sensor 7" that is not provided with the RTC 75 and the RTC controller 76, and of a data collection relay 6" that is provided with the RTC 75 and the RTC controller 76.

The CT sensor 7" shown in FIG. 23 transmits measurement data (the power spectrum of the fundamental wave, the third harmonic, and the fifth harmonic) to the data collection relay 6" every time the measurement component 71 takes a measurement. With the data collection relay 6", the RTC controller 76 transmits the time information acquired from the RTC 75 to the management database 62, and the management database 62 adds time information to the measurement data transmitted from the CT sensor 7" and stores the result (see the measurement information table 202 in FIG. 8).

Also, the transmitter 63*b* of the data collection relay 6" transmits a relay management code, a sensor ID, item information, and detection data to the power management device 51.

(L)

In the above embodiment, the power management device 51 has the abnormality notification unit 563 as an example of a second transmitter, and the power management device 51 reports an abnormality, but if abnormalities are determined by the data collection relay 6 as in (J-1) above, the data collection relay 6 may have the abnormality notification unit 563. Also, if abnormalities are determined by the CT sensor 7 as in (J-2) above, the CT sensor 7 may have the abnormality notification unit 563.

In addition, notification of abnormalities is not limited to notification to the maintenance management center 4, and light or sound may also be emitted.

(M)

In the above embodiment, performing the control method for the harmonic detection system and the harmonic detection method according to the flowcharts shown in FIGS. 5, 6, 9, 10, 16, and 19 was described as an example of a harmonic detection system control method and a harmonic detection method, but this is not the only option.

For instance, the present invention may be worked as a harmonic detection program that causes a computer to execute all or part of the harmonic detection method conducted according to the flowcharts shown in FIGS. 5, 6, 9, 10, 16, and 19.

In addition, one usage mode of the harmonic detection program may be a mode in which the program is recorded to a ROM or other such recording medium that can be read by a computer and in which that the operation is performed in conjunction with the computer.

Also, one usage mode of the harmonic detection program may be mode in which the program is transmitted over the Internet or another such transmission medium, or through a transmission medium such as light, radio waves, or sound waves, is read by a computer, and operates in conjunction with a computer.

The computer mentioned above may be one that includes not only hardware such as a CPU, but also firmware, an OS, and peripheral devices.

As described above, harmonic detection may be realized as software or hardware.

INDUSTRIAL APPLICABILITY

The harmonic detection system of the present invention has the effect of being able to quickly detect abnormalities at low cost, and is widely applicable, for example, to the monitoring of harmonic waves in power distribution networks in countries where power infrastructure is underdeveloped, such as India and ASEAN countries.

REFERENCE SIGNS LIST

1: harmonic detection system
2: first power management center
3: second power management center
4: maintenance management center
5: power management center
6: data collection relay (example of a relay)
6': data collection relay (example of a relay)
6": data collection relay (example of a relay)
7: CT sensor (example of a measuring instrument)
7': CT sensor (example of a measuring instrument)
7": CT sensor (example of a measuring instrument)
8: smart meter
9: smartphone (example of a notification device)
10: power distribution network system
21: first power management device
22: management database
23: display unit
24: communication unit
24a: receiver
24b: transmitter
31: second power management device
32: management database
33: display unit
41: maintenance management device (example of a maintenance device)
42: display unit
43: abnormality receiver
44: transmitter (example of a first transmitter)
51: power management device (example of a management device)
52: display unit
53: communication unit
53a: receiver
53b: transmitter
54: management database (example of a storage unit)
55: communication unit
55b: transmitter
56: abnormality determination unit
56': abnormality determination unit
56": abnormality determination unit
57: communication unit
57a: receiver
58: communication unit
58a: receiver
58b: transmitter
61: communication unit
61a: receiver
62: management database
63: communication unit
63a: receiver
63b: transmitter
71: measurement component (example of a measurement component)
72: power supply unit
73: transmitter
74: setting unit
75: RTC
76: RTC controller
77: management database
81: power measurement component
82: setting unit
83: transmitter
91: receiver
92: display unit
93: usage fee confirmation input unit
94: transmitter
100: power distribution network
101: power pole
102: power pole
103: distribution line (example of a power line)
104: distribution line (example of a power line)
105: distribution line (example of a power line)
106: distribution line (example of a power line)
107: distribution line (example of a power line)
108: distribution line (example of a power line)
109: house
110: house
111: factory
201: setting information table
202: measurement information table
203: setting information table
204: measurement information table
205: position information management table
206: user management table
207: abnormality management table
561: harmonic abnormality determination unit (example of a harmonic detector)
562: abnormality registration unit
563: abnormality notification unit (example of a second transmitter; example of a transmitter)

The invention claimed is:
1. A harmonic detection system, comprising:
a measurement component configured to be installed at a specific position on a power line constituting a distribution network, the measurement component measuring data related to current of the power line;
a harmonic detector configured to use some or all of the data related to the current as detection data to detect a harmonic;
a first transmitter configured to transmit a notification indicating that an abnormality has occurred in the power line when the harmonic is detected;

a notification device configured to be owned by a user of power supplied by the power line, the notification device receiving the notification from the first transmitter and notifying the user that the abnormality has occurred in the power line when the harmonic is detected; and a storage unit configured to store data of the measurement component in association with data of the notification device; and a smart meter configured to detect an amount of power supplied to the power line, wherein the storage unit is configured to:

store identification information of the measurement component in association with identification information unique to the smart meter configured to measure power of the power line on which the measurement component is installed, and store the identification information unique to the smart meter in association with the notification device of a user who owns the smart meter, and wherein when the harmonic is detected, the first transmitter is configured to transmit the notification to the notification device that is associated with the identification information of the measurement device measuring the current used in detecting the harmonic via the identification information unique to the smart meter in the storage unit.

2. The harmonic detection system according to claim 1, wherein the first transmitter is configured to transmit information related to detection of the harmonic to the notification device when the harmonic is detected and there is a registered user of the power supplied by the power line.

3. The harmonic detection system according to claim 1, further comprising:

a measuring instrument including the measurement component, the measuring instrument configured to transmit the detection data; and a management device including the harmonic detector, the management device configured to receive the detection data.

4. The harmonic detection system according to claim 3, wherein the measuring instrument is installed on each of a plurality of power lines, and the system further comprises a relay configured to receive the detection data transmitted from a plurality of measuring instruments, the relay configured to transmit the detection data to the management device.

5. The harmonic detection system according to claim 1, comprising:

a measuring instrument including the measurement component, the measuring instrument configured to transmit the detection data;

a relay including the harmonic detector, the relay configured to receive the detection data and transmit detection result data related to detection result produced by the harmonic detector; and a management device configured to receive the detection result data.

6. The harmonic detection system according to claim 1, further comprising:

a measuring instrument including the measurement component and the harmonic detector, the measuring instrument configured to transmit detection result data related to harmonic detection result produced by the harmonic detector; and a management device configured to receive the detection result data.

7. The harmonic detection system according to claim 2, further comprising:

a second transmitter configured to transmit detection result data related to detection result produced by the harmonic detector to a maintenance device configured to maintain the power line, when the harmonic detector has detected the harmonic, wherein the first transmitter is provided to the maintenance device.

8. The harmonic detection system according to claim 1, wherein the detection data includes information about a fundamental wave of current of the power line, and about a harmonic to the fundamental wave.

9. The harmonic detection system according to claim 8, wherein the information related to the fundamental wave and the harmonic is a power spectrum of the fundamental wave and the harmonic, and the harmonic detector determines that the harmonic is included in the fundamental wave when a ratio of the harmonic to the fundamental wave is at or over a preset threshold.

10. The harmonic detection system according to claim 9, wherein a plurality of the thresholds are set so as to increase in stages, and the harmonic detector determines that a degree of abnormality due to the harmonic is greater the more a larger threshold is exceeded.

11. The harmonic detection system according to claim 8, wherein the information about harmonics to the fundamental wave includes at least information about a third harmonic and a fifth harmonic to the fundamental wave.

12. The harmonic detection system according to claim 4, wherein a plurality of the relays are provided, a plurality of measuring instruments are divided into a plurality of groups, each of the relays is configured to receive the detection data and identification information of the measurement devices from the plurality of measuring instruments belonging to each group, and transmit identification information of the relays along with the detection data and the identification information of the measuring instruments, and the management device includes a storage unit configured to store the detection data in association with identification information of the measuring instruments and identification information of the relays.

13. The harmonic detection system according to claim 5, wherein a plurality of the measuring instruments are provided, a plurality of the relays are provided, the plurality of measuring instruments are divided into a plurality of groups, each of the relays is configured to receive the detection data and identification information of the measuring instruments from the plurality of measuring instruments belonging to each group, and transmit identification information of the relays along with the detection data and the identification information of the measuring instruments, and the management device includes a storage unit configured to store the detection result data in association with identification information of the measuring instruments and identification information of the relays.

14. The harmonic detection system according to claim 6, wherein the management device includes a storage unit configured to store identification information of the measuring instrument in association with the detection result data.

15. The harmonic detection system according to claim 1, further comprising a storage unit configured to store the detection data or detection result data related to the detection data produced by the harmonic detector, in association with time information.

16. A harmonic detection system according to claim 1, further comprising:
a transmitter configured to transmit detection result data related to the detection result produced by the harmonic detector to a maintenance device configured to maintain the power line, when the harmonic detector has detected the harmonic.

* * * * *